United States Patent
Kim et al.

(10) Patent No.: US 11,594,293 B2
(45) Date of Patent: Feb. 28, 2023

(54) MEMORY DEVICE WITH CONDITIONAL SKIP OF VERIFY OPERATION DURING WRITE AND OPERATING METHOD THEREOF

(71) Applicant: SAMSUNG ELECTRONICS CO., LTD., Suwon-si (KR)

(72) Inventors: Garam Kim, Seongnam-si (KR); Hyunggon Kim, Hwaseong-si (KR); Jisang Lee, Iksan-si (KR); Joonsuc Jang, Hwaseong-si (KR); Wontaeck Jung, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 2 days.

(21) Appl. No.: 17/336,910

(22) Filed: Jun. 2, 2021

(65) Prior Publication Data
US 2022/0013184 A1    Jan. 13, 2022

(30) Foreign Application Priority Data

Jul. 10, 2020    (KR) .................. 10-2020-0085683
Nov. 18, 2020    (KR) .................. 10-2020-0154579

(51) Int. Cl.
*G11C 16/12*    (2006.01)
*G11C 16/34*    (2006.01)
(Continued)

(52) U.S. Cl.
CPC .......... *G11C 16/3459* (2013.01); *G11C 16/12* (2013.01); *G11C 16/24* (2013.01);
(Continued)

(58) Field of Classification Search
CPC ..... G11C 16/3459; G11C 16/12; G11C 16/24; G11C 16/26; G11C 16/30; G11C 16/3404;
(Continued)

(56) References Cited

U.S. PATENT DOCUMENTS

| | | | |
|---|---|---|---|
| 6,888,758 | B1 | 5/2005 | Hemink et al. |
| 7,327,609 | B2 | 2/2008 | Kim et al. |

(Continued)

FOREIGN PATENT DOCUMENTS

| | | |
|---|---|---|
| KR | 10-0660534 | 12/2006 |
| KR | 10-0751579 | 8/2007 |
| KR | 10-1317625 | 10/2013 |

OTHER PUBLICATIONS

Extended European search report dated Oct. 15, 2021 in corresponding EP Patent Application No. 21180122.0.

*Primary Examiner* — Xiaochun L Chen
(74) *Attorney, Agent, or Firm* — F. Chau & Associates, LLC

(57) ABSTRACT

A memory device includes a memory cell array including a plurality of memory cells; a voltage generator configured to generate voltages used for a program operation and a verify operation for the memory cells; and control logic configured to perform a plurality of program loops while writing data to the memory cell array, such that first to N-th (e.g., N>=1) program loops including a program operation and a verify operation are performed and at least two program loops in which the verify operation is skipped are performed when a pass/fail determination of the program operation in the N-th program loop indicates a pass.

20 Claims, 14 Drawing Sheets

(51) Int. Cl.
  *G11C 16/24*   (2006.01)
  *G11C 16/26*   (2006.01)
  *G11C 16/30*   (2006.01)

(52) U.S. Cl.
  CPC .............. *G11C 16/26* (2013.01); *G11C 16/30* (2013.01); *G11C 16/3404* (2013.01)

(58) Field of Classification Search
  CPC . G11C 16/34; G11C 16/3436; G11C 16/3463; G11C 16/3454; G11C 16/10
  See application file for complete search history.

(56) References Cited

U.S. PATENT DOCUMENTS

| | | |
|---|---|---|
| 7,616,481 B2 | 11/2009 | Mokhlesi et al. |
| 7,652,929 B2 | 1/2010 | Li |
| 7,948,804 B2 | 5/2011 | Komatsu |
| 8,054,682 B2 | 11/2011 | Kang et al. |
| 8,174,899 B2 | 5/2012 | Ueno |
| 8,498,160 B2 | 7/2013 | Kim et al. |
| 8,675,416 B2 | 3/2014 | Lee |
| 9,640,274 B1 | 5/2017 | Kondo |
| 10,395,739 B2 | 8/2019 | Kondo |
| 2010/0232228 A1 | 9/2010 | Jeon et al. |
| 2011/0161571 A1 | 6/2011 | Kim et al. |
| 2012/0218826 A1 | 8/2012 | Lee |
| 2017/0125117 A1* | 5/2017 | Tseng ................... G11C 16/10 |

* cited by examiner

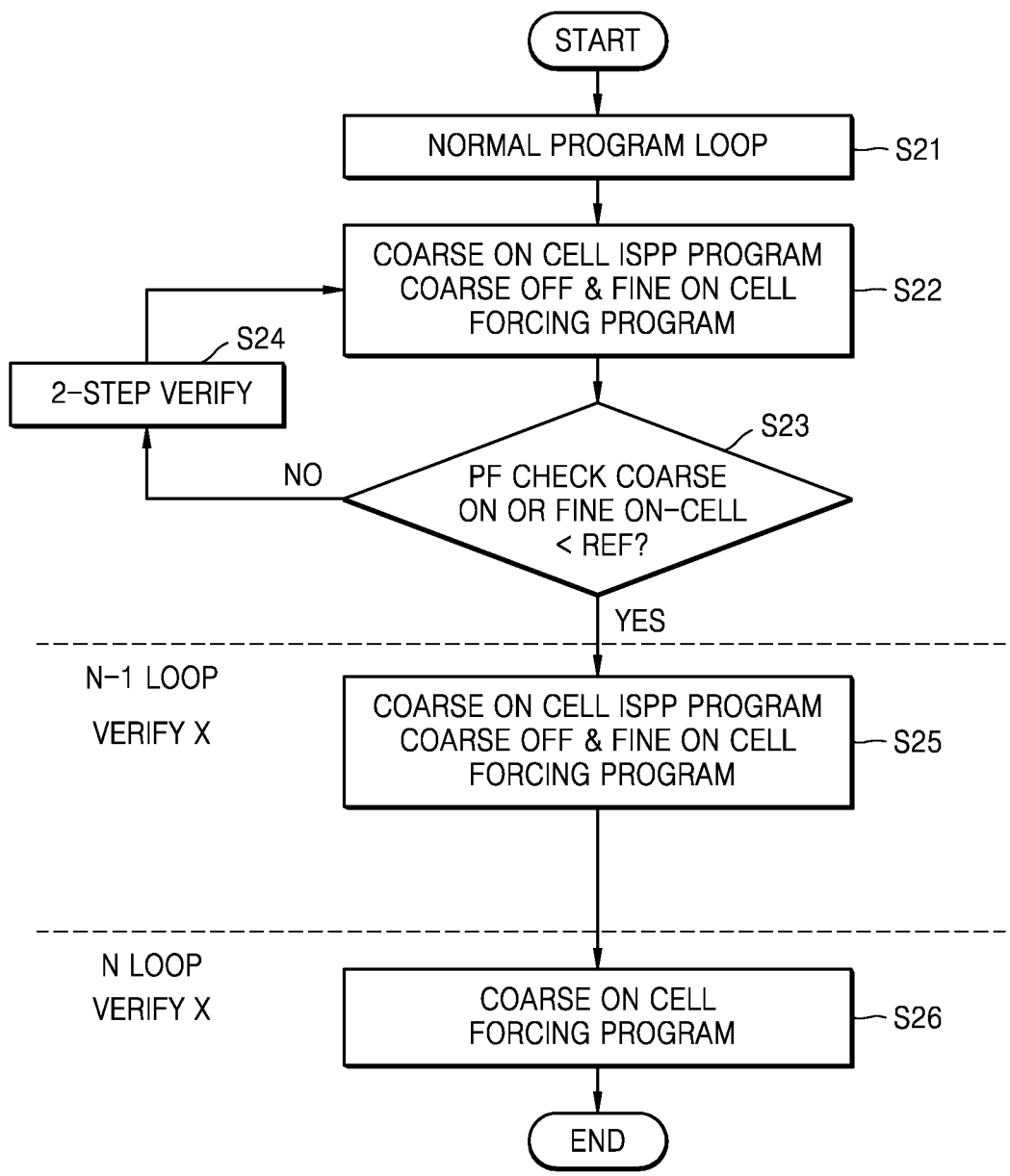

MEMORY DEVICE WITH CONDITIONAL SKIP OF VERIFY OPERATION DURING WRITE AND OPERATING METHOD THEREOF

CROSS-REFERENCE TO RELATED APPLICATIONS

This U.S. non-provisional patent application claims priority under 35 U.S.C. § 119 to Korean Patent Application No. 10-2020-0085683, filed on Jul. 10, 2020, and Korean Patent Application No. 10-2020-0154579, filed on Nov. 18, 2020 in the Korean Intellectual Property Office, the disclosures of which are incorporated by reference in their entirety herein.

BACKGROUND

1. Technical Field

The inventive concept relates to a memory device, and more particularly, to a memory device with improved write operation speed and an operating method thereof.

2. Discussion of Related Art

Semiconductor memory is a digital electronic semiconductor device used for digital data storage. A semiconductor memory may include a non-volatile memory device that retains stored information even after power is removed. Flash memory is an example of a non-volatile memory device. For example, flash memory may be used in cellular phones, digital cameras, portable digital assistants (PDAs), mobile computer devices, and stationary computer devices.

A plurality of program loops may be performed to write data to a non-volatile memory device. A program operation and a verify operation may be performed in each of the program loops. The time elapsed for a write operation may be significant due to each verify operation. Particularly, an increase in the number of verify operations may significantly increase the amount of time it takes to complete a write operation.

SUMMARY

At least one embodiment of the inventive concept provides a memory device with a write operation speed improved by performing an optimal program operation and an optimal verify operation and an operating method thereof.

According to an example embodiment of the inventive concept, there is provided a memory device including a memory cell array including a plurality of memory cells; a voltage generator configured to generate voltages used for a program operation and a verify operation for the memory cells; and a control logic configured to perform a plurality of program loops while writing data to the memory cell array, such that first to N-th program loops including a program operation and a verify operation are performed and at least two program loops in which the verify operation is skipped are performed when a pass/fail determination of the program operation in the N-th program loop indicates a pass. N is an integer equal to or greater than 1.

According to example embodiment of the inventive concept, there is provided a method of operating a memory device, the method including performing an N-th program loop including a program operation and a verify operation; determining whether the program operation is a pass or a fail by counting a number of memory cells of the memory device having threshold voltage levels lower than a predetermined threshold voltage; when it is determined that the program operation is pass, performing a (N+1)-th program loop including a normal program operation using a normal program voltage for first memory cells among the memory cells, and a forcing program operation using a forcing program voltage for second memory cells among the memory cells; and performing an (N+2)-th program loop including a forcing program operation using the forcing program voltage for the first memory cells, wherein a verify operation is skipped in each of the (N+1)-th program loop and the (N+2)-th program loop. N is an integer equal to or greater than 1.

According to example embodiment of the inventive concept, there is provided a method of operating a memory device. The method includes performing first to N-th program loops each including a program operation and a verify operation for memory cells of the memory device; determining whether the program operation is a pass or fail based on a programming result in the N-th program loop; and, when it is determined that the program operation is a pass, performing (N+1)-th to (N+A)-th program loops that do not include a verify operation for the memory cells. In each of the (N+1)-th to (N+A)-th program loops, at least one of a normal program operation using a normal program voltage and a forcing program operation using a forcing program voltage is performed. N is an integer equal to or greater than 2, and A is an integer equal to or greater than 2.

BRIEF DESCRIPTION OF THE DRAWINGS

Embodiments of the inventive concept will be more clearly understood from the following detailed description taken in conjunction with the accompanying drawings in which:

FIG. 6 is a flowchart of a detailed implementation example of a write operation according to an example embodiment of the inventive concept;

DETAILED DESCRIPTION OF THE EXAMPLE EMBODIMENTS

Figure 1:
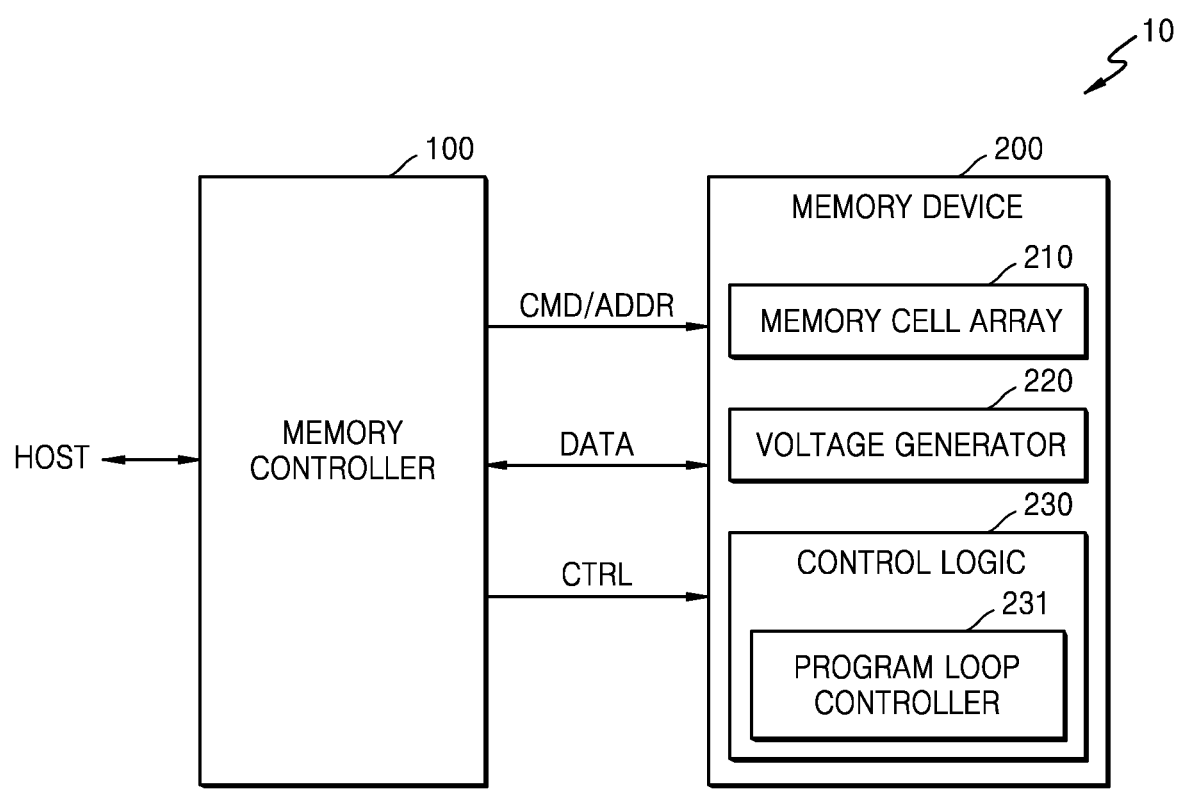
FIG. 1 is a block diagram showing a memory system according to an example embodiment of the inventive concept.

FIG. 1 is a block diagram showing a memory system according to an example embodiment of the inventive concept.

Referring to FIG. 1, a memory system 10 includes a memory controller 100 (e.g., a control circuit) and a memory device 200. The memory device 200 includes a memory cell array 210, a voltage generator 220 (or voltage controller), and a control logic 230 (e.g., a logic circuit). The control logic 230 includes a program loop controller 231 (e.g., a control circuit). Although FIG. 1 shows an example in which the program loop controller 231 is included in the control logic 230, the program loop controller 231 according to an embodiment of the inventive concept may be a separate component located outside the control logic 230. Also, the program loop controller 231 may perform functions according to an embodiment of the inventive concept through various methods. For example, the program loop controller 231 may be implemented as a hardware circuit, software executable by a processor, or a combination thereof.

According to an example embodiment, the memory device 200 includes a non-volatile memory device. In some embodiments, the memory system 10 may be implemented as a memory that may be embedded with or detachable from an electronic device. For example, the memory system 10 may be implemented in various forms like an embedded Universal Flash Storage (UFS) memory device, an embedded Multi-Media Card (eMMC), a Solid State Drive (SSD), a UFS memory card, a Compact Flash (CF) memory card, a Secure Digital (SD) memory card, a Micro Secure Digital (Micro-SD) memory card, a Mini Secure Digital (Mini-SD) memory card, an extreme digital (xD) memory card, or a memory stick.

The memory controller 100 may control the memory device 200 to read data stored in the memory device 200 or to write data to the memory device 200 in response to a write/read request from a host HOST. In detail, the memory controller 100 may provide an address ADDR, a command CMD, and a control signal CTRL to the memory device 200 to control a write operation, a read operation, and an erase operation for the memory device 200. Also, data DATA to be stored in the memory device 200 and data DATA read from the memory device 200 may be transmitted and received between the memory controller 100 and the memory device 200.

The memory cell array 210 may include a plurality of memory cells. For example, the memory cells may be flash memory cells. Hereinafter, embodiments of the inventive concept will be described in detail based on an example case where the memory cells are NAND flash memory cells. However, the inventive concept is not limited thereto, and, in some embodiments, the memory cells may be resistive memory cells like resistive RAM (ReRAM) cells, phase change RAM (PRAM) cells, and magnetic RAM (MRAM) cells.

In an embodiment, the memory cell array 210 include a 3-dimensional memory cell array. The 3-dimensional memory cell array may include a plurality of NAND strings, and each NAND string may include memory cells respectively connected to word lines vertically stacked on a substrate. U.S. Pat. Nos. 7,679,133, 8,553,466, 8,654,587, 8,559,235, and U.S. Patent Application Publication No. 2011/0233648, the disclosures of which are incorporated by reference herein in their entirety, disclose detailed suitable configurations for a 3-dimensional memory array including multiple levels and in which word lines and/or bit lines are shared between the levels. However, the inventive concept is not limited thereto. In some embodiments, the memory cell array 210 may include a 2-dimensional memory cell array, and the 2-dimensional memory cell array may include a plurality of NANDs arranged in a row-wise direction and a column-wise direction.

As a write command requesting a write operation is provided from the memory controller 100 to the memory device 200, a write operation may be performed under the control of the control logic 230. A write operation may be performed through a plurality of program loops, and a period in which the program loops are performed may be referred to as a program cycle. In other words, an operation for writing data to memory cells of the memory cell array 210 may include a plurality of program loops within a program cycle. A program operation using a program voltage and a verify operation using a verify voltage may be performed in any one program loop. In an example embodiment of the inventive concept, the program operation and the verify operation are performed together in some of the program loops, whereas only the program operation is selectively performed in the other program loops.

The voltage generator 220 may generate various voltages used in the memory device 200. For example, a program voltage provided to a selected word line for a program operation, and an inhibit voltage provided to unselected word line may be generated. Also, the voltage generator 220 may further generate a verify voltage used for a verify operation for verifying a program operation and an erase voltage provided to word lines during an erase operation. Also, although not shown in FIG. 2, the voltage generator 220 may further generate a string select voltage and a ground select voltage respectively provided to string select lines and ground select lines.

The control logic 230 may control the overall operation of the memory device 200. For example, based on a command CMD, an address ADDR, and a control signal CTRL received from the memory controller 100, the control logic 230 may output various internal control signals for programming data to the memory cell array 210 or reading data from the memory cell array 210. Also, the control logic 230 may output a voltage control signal (not shown) for adjusting levels of various voltages output from the voltage generator 220 in relation to a program operation, a read operation, and an erase operation.

According to an example embodiment, the program loop controller 231 controls program loops that are executed to write data to the memory cell array 210. For example, the program loop controller 231 may control program loops in various ways. For example, the program loop controller 231 may control the number of program loops within a program cycle, or control various voltage levels used for a program operation and a verify operation for each program loop. For example, the program loop controller 231 may perform a determination operation for determining a pass or a fail of a program operation during a process of executing a program loop. According to a result of the determination, subsequent program loops may be controlled to skip a verify operation. Also, according to an embodiment of the inventive concept, when the result of the determination result is a pass, subsequent program loops are controlled, such that a verify operation is skipped in at least two of the subsequent program loops. In other words, in embodiments of the inventive concept, because the number of program loops in which verify operations are performed within one program cycle are reduced, a time elapsed for a data write operation may be reduced.

Figure 2:
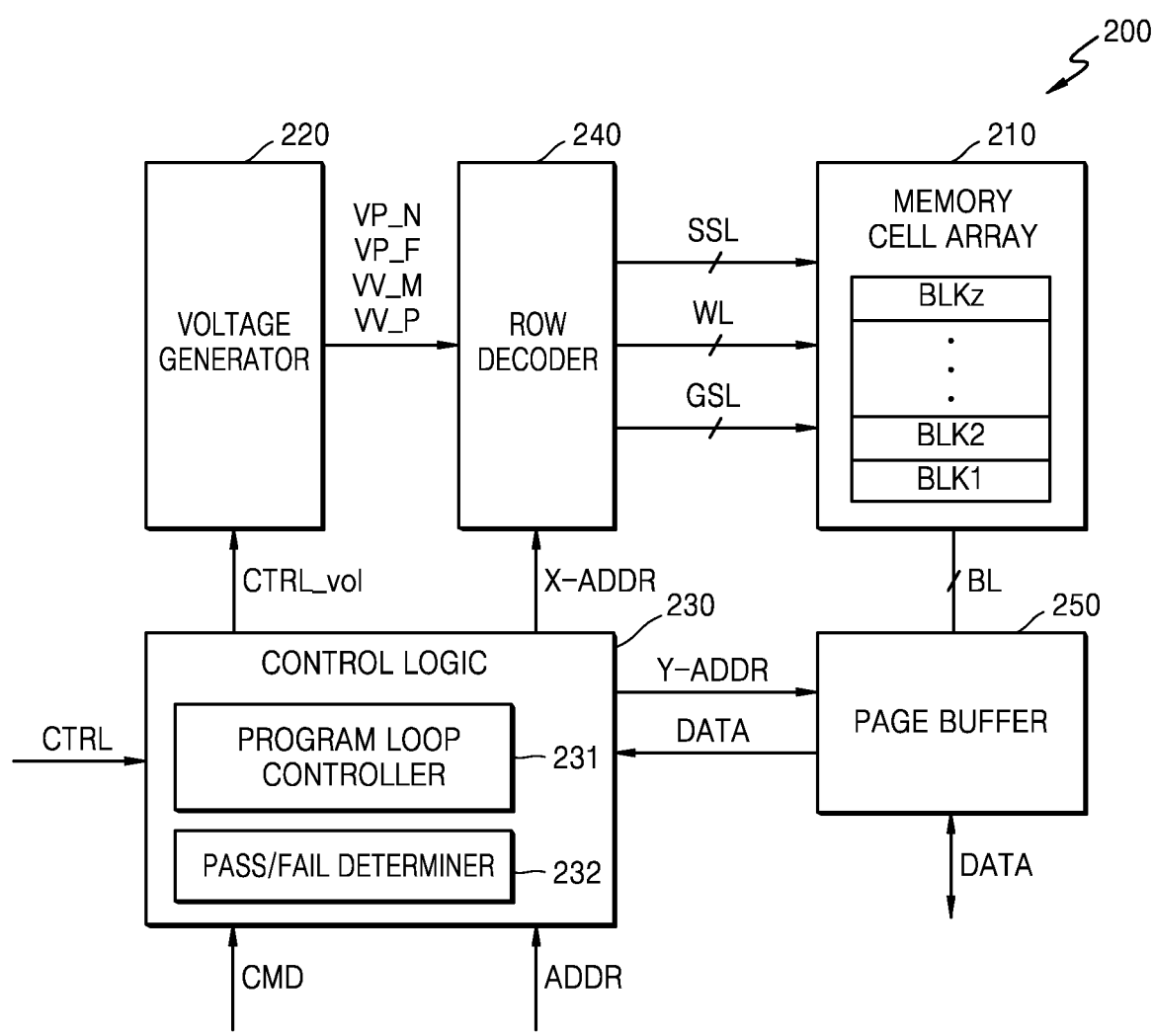
FIG. 2 is a block diagram showing an example implementation of the memory device of FIG. 1.

FIG. 2 is a block diagram showing an example implementation of the memory device of FIG. 1.

Referring to FIGS. 1 and 2, the memory device 200 includes the memory cell array 210, the voltage generator 220, the control logic 230, a row decoder 240 (e.g., a decoder circuit), and a page buffer 250. Although not shown in FIG. 2, the memory device 200 may further include various other components related to a memory operation, e.g., a data input/output circuit or an input/output interface.

The memory cell array 210 may include a plurality of memory blocks BLK1 to BLKz and may be connected to word lines WL, string select lines SSL, ground select lines GSL, and bit lines BL. The memory cell array 210 may be connected to the row decoder 240 through the word lines WL, the string select lines SSL, and the ground select lines GSL and may be connected to the page buffer 250 through the bit lines BL. Each memory cell may store one or more bits. For example, each memory cell may correspond to a single-level cell (SLC), a multi-level cell (MLC), a triple-level cell (TLC), or a quad-level cell (QLC).

The control logic 230 may output various internal control signals for programming data to the memory cell array 210 or reading data from the memory cell array 210 based on a command CMD, an address ADDR, and a control signal CTRL received from the memory controller 100. The control logic 230 may output a voltage control signal CTRL_vol for controlling levels of various voltages generated by the voltage generator 220. Also, FIG. 2 shows that the program loop controller 231 and a pass/fail determiner 232 (e.g., a determination circuit) are components included in the control logic 230. However, embodiments of the inventive concept are not necessarily limited thereto, and at least one of the program loop controller 231 and the pass/fail determiner 232 may be located outside the control logic 230.

The control logic 230 may provide a row address X_ADDR to the row decoder 240 and provide a column address Y_ADDR to the page buffer 250. During a program operation, in response to a row address X-ADDR, the row decoder 240 may provide a program voltage to a word line of a selected memory cell and provide an inhibit voltage to word lines of unselected memory cells.

According to an example embodiment of the inventive concept, the memory device 200 performs a program operation based on a 2-step verify operation. For example, a plurality of program loops may be performed within a program cycle, and a verify operation may be performed using at least two verify voltages after a program operation is performed in any one program loop. For example, the 2-step verify operation may include a first verify operation using a pre-verify voltage VV_P and a second verify operation using a main verify voltage VV_M. In an embodiment, the main verify voltage VV_M has a greater value than the pre-verify voltage VV_P.

From among a plurality of memory cells on which a program operation is executed, first memory cells having threshold voltages less than a predetermined first threshold voltage may be determined through the first verify operation, and the first memory cells may be referred to as coarse on cells. Also, through the second verify operation, memory cells having threshold voltages less than a predetermined second threshold voltage (for example, the second threshold voltage is set to be greater than the first threshold voltage) may be determined, and the memory cells having threshold voltages less than the second threshold voltage may be referred to as fine on cells. Also, in the below embodiments, based on the first verify operation and the second verify operation, memory cells having threshold voltages greater than the first threshold voltage and less than the second threshold voltage may be defined as second memory cells.

Also, it is described above that a main verify operation and a pre-verify operation are performed using the main verify voltage VV_M and the pre-verify voltage VV_P having different levels, respectively. However, embodiments of the inventive concept are not limited thereto. For example, in a verify operation, an operation for determining data based on different threshold voltage levels may be performed in various ways. For example, a verify operation may be performed in various ways by setting a level of a current used in the verify operation or setting a sensing timing for data.

In a next program loop, a program operation may be performed based on a result of the above-stated verification. In the program operation, different types of program operations may be performed for memory cells determined as the first memory cells and the second memory cells. For example, a normal program operation may be performed on the first memory cells, whereas a forcing program operation may be performed on the second memory cells. In a forcing program operation, compared to a normal program operation, a difference between levels of voltages applied between a word line and a bit line connected to a memory cell is less than that in the normal program operation. Thus, the level of a threshold voltage changed as the forcing program operation is performed may be smaller than that of the normal program operation. For example, voltages of various levels may be set for a bit line (BL) in a program operation. As BL forcing is applied in a forcing program operation, the level of a voltage set to the bit line may be greater than that of a normal program operation. Alternatively, the level of a program voltage applied to a word line in a forcing program operation may be set to be less than that of a normal program operation.

In the below embodiments, it is assumed that the level of a voltage (e.g., a forcing program voltage VP_F) applied to a word line in a forcing program operation is relatively small compared to a voltage (e.g., a normal program voltage VP_N) applied to the word line in a normal program operation. However, as described above, embodiments of the inventive concept are not necessarily limited thereto. As a forcing program operation is performed through a bit line setup setting, bit line setup levels are set differently in a normal program operation and the forcing program operation. In an embodiment, voltages of substantially the same level or exactly the same level are provided to a word line in the forcing program operation and the normal program operation.

The program loop controller 231 may control operation of program loops within a program cycle according to embodiments of the inventive concept. According to an example embodiment, the program loop controller 231 may perform a control operation for various environment settings like voltage levels related to a program operation and a verify operation, in each program loop. Also, the program loop controller 231 may determine whether to perform a verify operation in each program loop and perform a control operation, such that the verify operation is performed or skipped.

In an embodiment, the pass/fail determiner 232 receives data DATA through the page buffer 250 and determines a pass/fail of a program operation based on a result of determining the state of the data DATA. In an example embodiment, a pass/fail of a program operation is determined by determining the number of memory cells having threshold voltages less than the first threshold voltage (e.g., coarse on cells) or the number of memory cells having threshold voltages less than the second threshold voltage (e.g., fine on cells). In an example embodiment of the inventive concept, when a predetermined reference value is set and the number of coarse on cells or the number of fine on cells (or the number of failed memory cells) is less than the reference value, a corresponding program operation may be determined as a pass.

According to an example embodiment of the inventive concept, after the pass/fail determiner 232 determines a pass of a program operation, at least two program loops may be further performed. For example, when the number of failed memory cells is less than the reference value, this may indicate that all memory cells have threshold voltages corresponding to those of passed memory cells by additionally performing a small number of program loops, and, in embodiments of the inventive concept, a verify operation is skipped in the additional program loops. In other words, as compared to a case of terminating a program cycle when a pass has been determined after a general program loop is performed, in embodiments of the inventive concept, a verify operation is skipped in additional program loops after a pass has been determined. Therefore, because the number of verify operations performed in one program cycle may be reduced, the time elapsed for an overall write operation may be reduced.

Meanwhile, the page buffer 250 may operate as a write driver or a sense amplifier according to operation modes. The page buffer 250 may include a plurality of buffer units connected to a plurality of bit lines BL. Each buffer unit may include one or more latches that store read data through a corresponding bit line BL. The above-stated bit line setup operation may be performed through the page buffer 250, and a bit line BL may be set at different levels for a program-inhibited memory cell, a memory cell to which a normal program operation is to be performed, and a memory cell to which a forcing program operation is to be performed, respectively. For example, data read in a pre-verify operation and data read in a main verify operation may be stored in the page buffer 250. Based on data stored in the page buffer 250, first memory cells and second memory cells may be determined, and a pass/fail determination operation may be performed based on the data.

Figure 3:
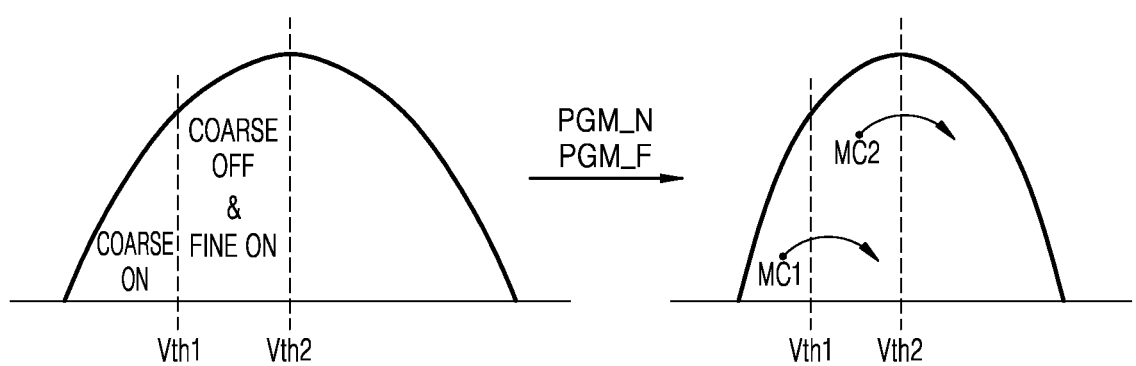
FIG. 3 is a diagram showing an example of a 2-step verify operation according to an example embodiment of the inventive concept.

FIG. 3 is a diagram showing an example of a 2-step verify operation according to an example embodiment of the inventive concept. FIG. 3 shows an example of a threshold voltage distribution of memory cells on which a program operation is performed.

Referring to FIGS. 2 and 3, in the case of memory cells to which data is written, a plurality of program loops may be performed, such that the memory cells have threshold voltages greater than a second threshold voltage Vth2 according to data values. In any one program loop, a 2-step verify operation may be performed after a program operation is performed, and coarse on cells and fine on cells may be determined by performing a verify operation based on a first threshold voltage Vth1 and the second threshold voltage Vth2. The 2-step verify operation may perform a read operation based on the first threshold voltage Vth1, which may be referred to as a coarse read. Also, the 2-step verify operation may perform a read operation based on the second threshold voltage Vth2, which may be referred to as a fine read. Memory cells may exhibit different threshold voltage fluctuations according to execution of a program operation due to their characteristics, and, even when they undergo the same program loop, some slow cells may have threshold voltage levels lower than the other memory cells. Thus, coarse on cells may be together with fine on cells.

After a 2-step verify operation as described above has completed, a program operation may be performed in a next program loop. For example, a normal program operation using a normal program voltage VP_N may be performed on first memory cells corresponding to coarse on cells, and a forcing program operation using a forcing program voltage VP_F may be performed on second memory cells corresponding to coarse off/fine on cells. Also, a 2-step verify operation may be performed based on the first threshold voltage Vth1 and the second threshold voltage Vth2. Through the program operation, memory cells MC1 previously corresponding to coarse on cells may be changed to fine on cells, and memory cells MC2 previously corresponding to coarse off/fine on cells may be changed to fine off cells.

Figure 4:
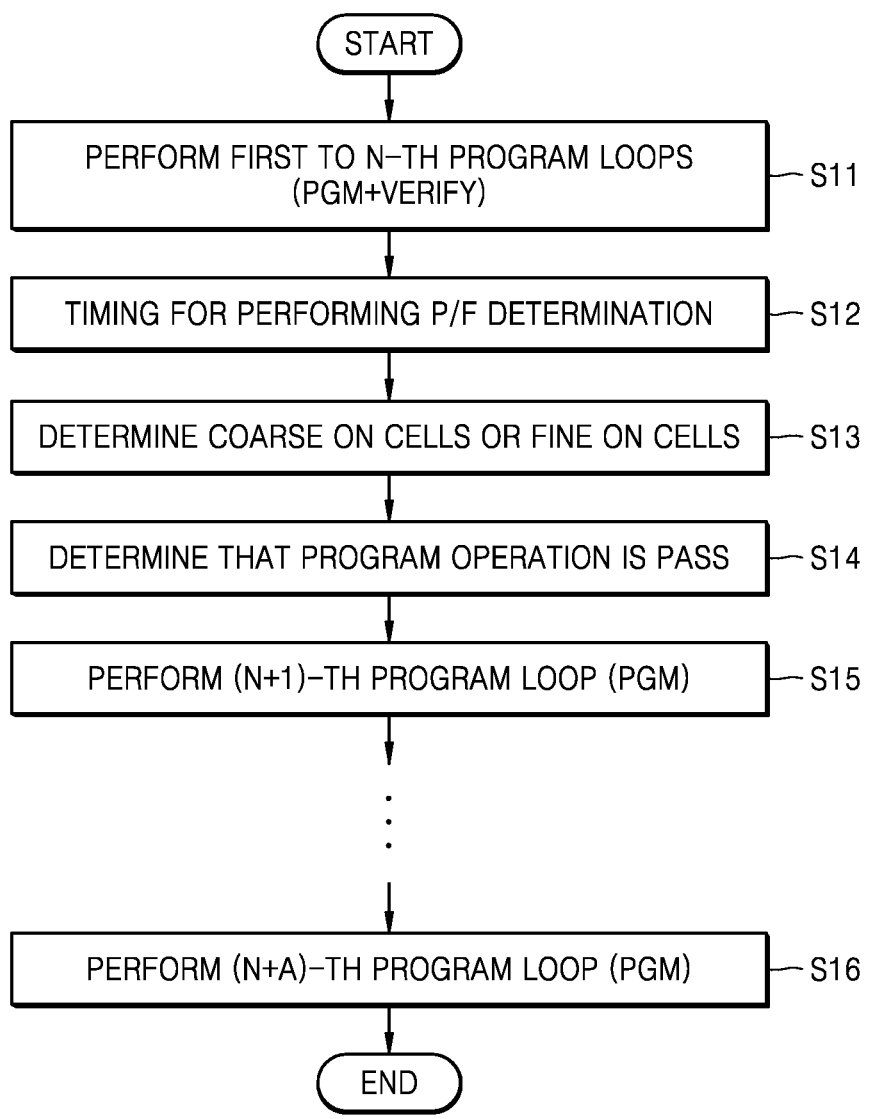
FIG. 4 is a flowchart of a method of operating a memory device according to an example embodiment of the inventive concept.

FIG. 4 is a flowchart of a method of operating a memory device according to an example embodiment of the inventive concept.

Referring to FIG. 4, in a memory system including a memory controller and a memory device, in response to a write request provided from a host, the memory controller 100 provides a write command to the memory device 200, and the memory device 200 performs a write operation including a plurality of program loops in response to the write command. Also, in an example embodiment, after a particular number of program loops are performed, threshold voltages of a plurality of memory cells of the memory cell array 210 from among memory cells to be programmed may increase above a target voltage. Thus a timing (or time) for determining a pass/fail of a program operation may be after the above-described particular number of program loops are performed.

In response to a write command, first to N-th program loops are performed (operation S11), and a program (PGM) operation and a verify operation are performed in each of the first to N-th program loops. Also, in an example embodiment, the first to N-th program loops are controlled, such that only a program operation is initially performed and a verify operation is performed from a particular time point thereafter. Also, in an example embodiment, the first to N-th program loops are controlled, such that only a normal program operation using a normal program voltage is initially performed and a forcing program operation is performed from a particular time point thereafter. Also, according to the above-described embodiments, a 2-step verify operation may be applied to the verify operation, and thus, verify operations using a pre-verify voltage and a main verify voltage may be performed. As a result, coarse on cells and fine on cells may be determined.

During the process of performing the first to N-th program loops described above, it is determined whether it is a timing (or time) for determining a pass/fail. For example, it may be determined that it is a timing (or time) to determine a pass/fail after an N-th program loop is performed (operation S12). In the case of a timing for determining pass/fail, coarse on cells or fine on cells are determined according to a result of performing the N-th program loop (operation S13), and it is determined that a program operation is a pass based on a result of the determination (operation S14). For example, a pass/fail determination operation may be performed by determining whether the number of coarse on cells is less than a predetermined reference value or determining whether the number of fine on cells is less than the predetermined reference value. In other words, when the number of coarse on cells or fine on cells is less than the predetermined reference value, it may indicate a state where threshold voltages of memory cells of a relatively large number from among memory cells to be programmed increase above a target voltage and a program operation is normally completed. Meanwhile, in the embodiment of FIG. 4, it is assumed that a result of the pass/fail determination operation is a pass. However, when it is determined that a program operation is a fail, an additional program loop and the above-stated pass/fail determination operation are performed again.

According to an example embodiment of the inventive concept, when it is determined that a program operation is a pass, a write operation may be completed by executing a program loop in which a verify operation is skipped a plurality of number of times. For example, after it is determined that a program operation is a pass, (N+1)-th to (N+A)-th program loops may be sequentially performed (operations S15 and S16), and a verify operation may be skipped in the (N+1)-th to (N+A)-th program loops. Also, in an example embodiment, a program operation using at least one of a normal program voltage and a forcing program voltage is performed in each of the (N+1)-th to (N+A)-th program loops, and a write operation may be completed after the (N+1)-th to (N+A)-th program loops are performed.

According to an example embodiment of the inventive concept as described above, a plurality of program loops not including a verify operation may be performed based on a result of determining that a program operation is a pass. As a plurality of program loops in which a verify operation is not performed are performed during an entire write operation, the total number of verify operations may be reduced. Also, by appropriately applying a normal program voltage and forcing program operation based on the number of coarse on cells and the number of fine on cells in (N+1)-th to (N+A)-th program loops in which a verify operation is skipped, a program operation may be adjusted, such that, while the threshold voltage distribution of memory cells increases above the target voltage, the threshold voltage does not increase much more than the target voltage to prevent a distribution width from widening.

Meanwhile, in the description of the embodiments of the inventive concept below, termination of a program operation according to completion of a program cycle may indicate that a write operation in response to a write command from a memory controller is terminated.

Figure 5:
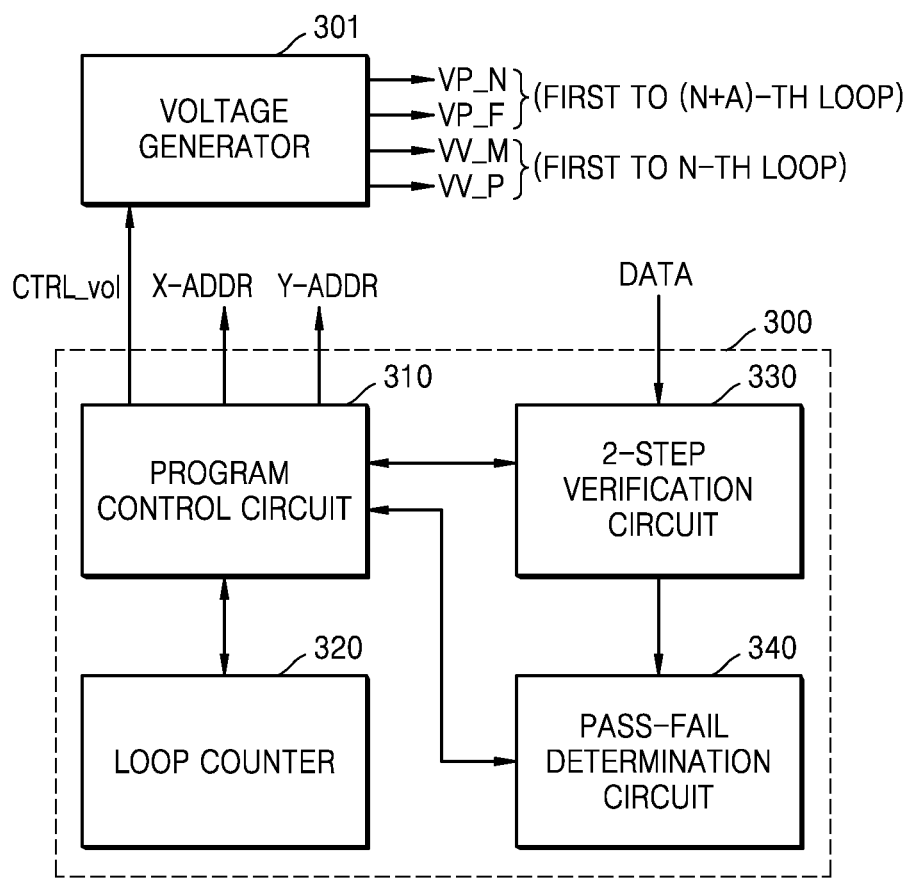
FIG. 5 is a block diagram showing an example implementation of a memory device according to an example embodiment of the inventive concept.

FIG. 5 is a block diagram showing an example implementation of a memory device according to an example embodiment of the inventive concept. FIG. 5 shows an example of implementation of a control logic provided in a memory device.

Referring to FIG. 5, a control logic 300 includes a program control circuit 310, a loop counter 320 (e.g., a counter circuit), a 2-step verification circuit 330, and a pass/fail determination circuit 340. The program loop controller shown in FIG. 1 may include at least some of the components of the control logic 300 shown in FIG. 5.

The program control circuit 310 may perform various control operations related to data writing in a memory device and output control signals for controlling other components. For example, the program control circuit 310 may output a voltage control signal CTRL_vol that controls a voltage generator 301 in a memory device, output a row address X-ADDR to a row decoder, and output a column address Y-ADDR to a column decoder (or a page buffer). According to the row address X-ADDR and the column address Y-ADDR, a 2-step verify operation and a program operation based thereon may be controlled. For example, a normal program operation may be performed on some memory cells from among memory cells to be programmed, a forcing program operation may be performed on some other memory cells, and a program operation may be inhibited for the other memory cells.

The loop counter 320 may internally set at least one reference value, count the number of times that program loops are performed to generate a counting result, and provide a result of comparing the counting result with the reference value. In an example embodiment, based on the counting result of the loop counter 320, a timing (or time) to start performing a pass/fail determination while performing program loops may be determined. Also, after it is determined that a program operation is a pass, a counting operation may be performed, such that program loops of a predetermined number of times are further performed.

The 2-step verification circuit 330 may determine coarse on cells and fine on cells through a verify operation according to the above-described embodiments. For example, the 2-step verification circuit 330 may receive data DATA read using a pre-verify voltage VV_P and data DATA read using a main verify voltage VV_M from a page buffer and, based on the same, determine coarse on cells and fine on cells. Also, through the 2-step verify operation described above, first memory cells corresponding to coarse on cells and second memory cells corresponding to coarse off/fine on cells may be determined. Also, the pass/fail determination circuit 340 may determine whether a program operation is a pass or a fail based on a verification result of the 2-step verification circuit 330. According to the above-described embodiments, a pass/fail determination circuit 340 may determine whether a program operation is a pass or a fail by comparing the number of coarse on cells or the number of fine on cells with a predetermined reference value.

The program control circuit 310 may perform various control operations based on a determination result of the pass/fail determination circuit 340. For example, when the determination result is a fail, the program control circuit 310 may output the voltage control signal CTRL_vol, such that the normal program voltage VP_N, the forcing program voltage VP_F, the main verify voltage VV_M, and the pre-verify voltage VV_P are output. As a result, both a program operation and a verify operation may be performed in a next program loop. On the other hand, when the determination result is a pass, the program control circuit 310 may output the voltage control signal CTRL_vol, such that a verify operation is skipped in a next program loop and only the normal program voltage VP_N and the forcing program voltage VP_F are output. FIG. 5 shows an example in which the normal program voltage VP_N and the forcing program voltage VP_F are generated in first to (N+A)-th program loops, whereas the main verify voltage VV_M and the pre-verify voltage VV_P are selectively generated in first to N-th program loops.

According to an example embodiment as stated above, a counter (not shown) capable of counting bit values of a plurality of memory cells may be provided in the pass/fail determination circuit 340. It may be determined whether a program operation is a pass or a fail in advance based on a counting result of the counter, and a write operation may be completed by performing at least two program operations while a verify operation is skipped in advance based on a result of the determination. Therefore, the total time elapsed for the write operation may be reduced.

FIG. 6 is a flowchart of a detailed implementation example of a write operation according to an example embodiment of the inventive concept.

Referring to FIG. 6, normal program loops are performed during operation S21. A normal program loop may correspond to a program loop including a program operation and a verify operation in the above-described embodiments. Also, a memory device may be pre-set, such that a pass/fail determination is performed in an (N−2)-th program loop. In the (N−2)-th program loop, a normal program operation is performed on first memory cells corresponding to coarse on cells and, at the same time, a forcing program operation is performed on second memory cells corresponding to coarse off/fine on cells (operation S22). As an incremental step pulse program (ISPP) in which the level of a program pulse gradually increases as program loops are performed is applied during the normal program operation, the normal program operation will be referred to as an ISPP program operation in FIG. 6.

On the other hand, it may be determined whether a program operation is a pass or a fail in the (N−2)-th program loop (operation S23). For example, it may be determined whether a program operation is pass or fail by comparing the number of coarse on cells or the number of fine on cells determined through a previous verify operation with a reference value Ref. According to an embodiment, it may be determined in the (N−2)-th program loop whether a program operation is a pass or a fail based on data stored in a page buffer through a previous verify operation (e.g., a verify operation performed in an (N−3)-th program loop). Also, in an example embodiment, a pass/fail determination operation in the (N−2)-th program loop may be performed in parallel with a program operation in a next (N−1)-th program loop.

When it is determined that a program operation is a fail, a program loop including a 2-step verify operation (operation S24) and a program operation (operation S22) may be performed again, and it may be determined again whether the program operation is a pass or a fail based on a result of the verify operation. On the other hand, when it is determined that a program operation is a pass, two or more additional program loops in which a 2-step verify operation is skipped may be performed according to example embodiments of the inventive concept.

When it is determined that the program operation is a pass, without performing a verify operation, in the (N−1)-th program loop, a normal program operation may be performed on first memory cells corresponding to coarse on cells and, at the same time, a forcing program operation may be performed on second memory cells corresponding to coarse off/fine on cells (operation S25). Also, a next program loop (e.g., an N-th program loop) may be performed. In the N-th program loop, a program operation may be selectively performed on memory cells determined as coarse on cells in a previous verification process, wherein the program operation may be a forcing program operation (operation S26).

According to an example embodiment as described above, a write operation may be completed by performing two more program operations without performing a separate verify operation after it is determined that a program operation is a pass. For example, after it is determined that a program operation is a pass, there may be first memory cells corresponding to coarse on cells and second memory cells corresponding to coarse off/fine on cells, and a write operation may be completed by performing a normal program operation and a forcing program operation on the first memory cells and performing a forcing program operation on the second memory cells.

Figure 7A:
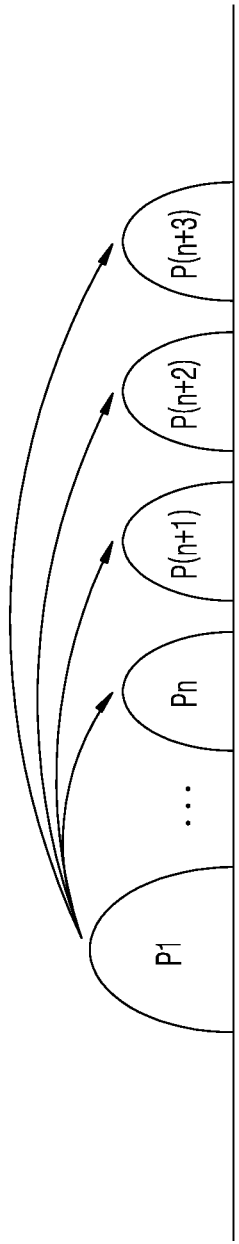
FIGS. 7A, 7B, and 7C show an example of a threshold voltage distribution fluctuating as program loops are performed, according to an example embodiment of the inventive concept.
Figure 7B:
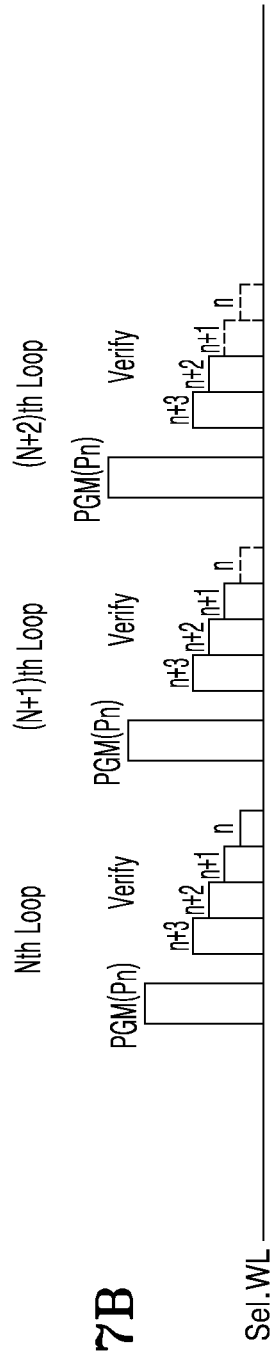
Figure 7C:
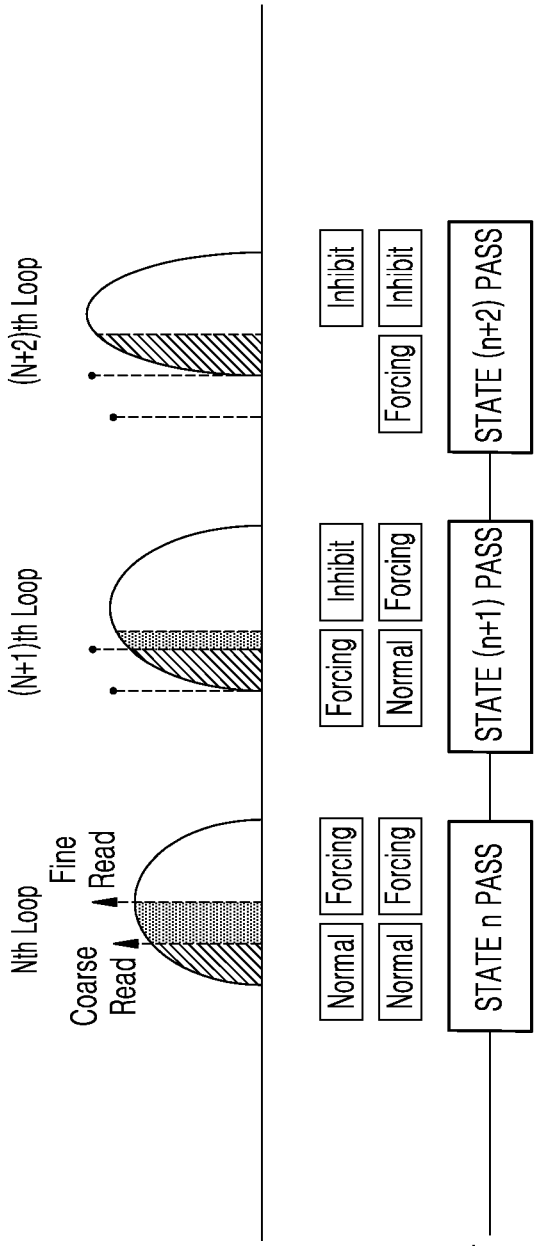

FIGS. 7A, 7B, and 7C show an example of a threshold voltage distribution fluctuating as program loops are performed, according to an example embodiment of the inventive concept. FIGS. 7A, 7B, and 7C show an operation example in a memory device including multi-level cells.

Memory cells may be programmed to any one of a plurality of states respectively corresponding to a plurality of threshold voltage distributions according to data values thereof. For example, the threshold voltage distributions may have four or more states. FIG. 7A exemplifies threshold voltage distributions having first to (n+3)-th states P1 to P(n+3). The first state P1 may correspond to an erase state, and, as program loops are performed, threshold voltages of memory cells may be changed from the first state P1 to the second to (n+3)-th states P2 to P(n+3). In each program loop, program operations for programming memory cells to the plurality of states may be performed. Also, in each program loop, a verify operation may be performed in relation to each state to verify a program operation of each of the states.

FIG. 7B shows an example of a voltage (or a voltage pulse) applied to a selected word line in a program loop. In FIG. 7B, for convenience of explanation, a program operation related to an n-th state Pn and a verify operation for n-th to (n+3)-th states in N-th to (N+2)-th program loops are exemplified. Also, FIG. 7C shows an example of a threshold voltage distribution fluctuating according to a program operation in relation to the n-th state Pn. Also, a pass/fail may be determined at a predetermined timing (or time). In an example embodiment, a pass/fail for the states may be determined at different timings (or times). For example, it is assumed that a pass/fail determination for the n-th state Pn is performed in the N-th program loop, a pass/fail determination for an (n+1)-th state Pn+1 is performed in the (N+1)-th program loop, and a pass/fail determination for an (n+2)-th state Pn+2 is performed in the (N+2)-th program loop. Also, FIG. 7C further shows an example of a program operation performed in each program loop in a program operation for programming to the n-th state Pn and the (n+1)-th state Pn+1.

First, a program voltage for a program operation may be applied in the N-th program loop, and a 2-step verify operation in the above-described embodiment may be performed for each of n-th to (n+3)-th states. Also, coarse-on cells (first memory cells) and coarse-off/fine on cells (second memory cells) may be determined in relation to the n-th state, and it is assumed that a program operation is determined as a pass according to a result of a pass/fail determination for a program operation to the n-th state.

According to the operation in the N-th program loop as described above, a verify operation related to the n-th state may be skipped in subsequent program loops as indicated by a dashed line. Also, in the (N+1)-th program loop, a normal program operation may be performed on first memory cells, and a forcing program operation may be performed on second memory cells. FIG. 7C shows an example in which a first memory cell is changed to a coarse off/fine on cell and a second memory cell is changed to a fine off cell, according to a program operation in the (N+1) program loop. Also, in the (N+1)-th program loop, a pass/fail determination may be performed in relation to the (n+1)-th state. When it is determined that a program operation is a pass, a verify operation related to the (n+1)-th state may be skipped in a next program loop (e.g., the (N+2)-th program loop).

In the (N+2)-th program loop, a forcing program operation may be selectively performed only on coarse off/fine on cells in relation to the n-th state, and the coarse off/fine on cells may be changed to fine off-cells according to the forcing program operation. Also, in the (N+2)-th program loop, a normal program operation and a forcing program operation may be performed in relation to the (n+1)-th state, and a forcing program operation may be performed in a next program loop. Also, in relation to the (n+2)-th state, a pass/fail determination may be performed in the (N+2) program loop. When it is determined that a program operation is a pass, a verify operation may be skipped in at least two program loops in which program operations to the (n+2)-th state are performed, according to the above-stated embodiments.

Figure 8:
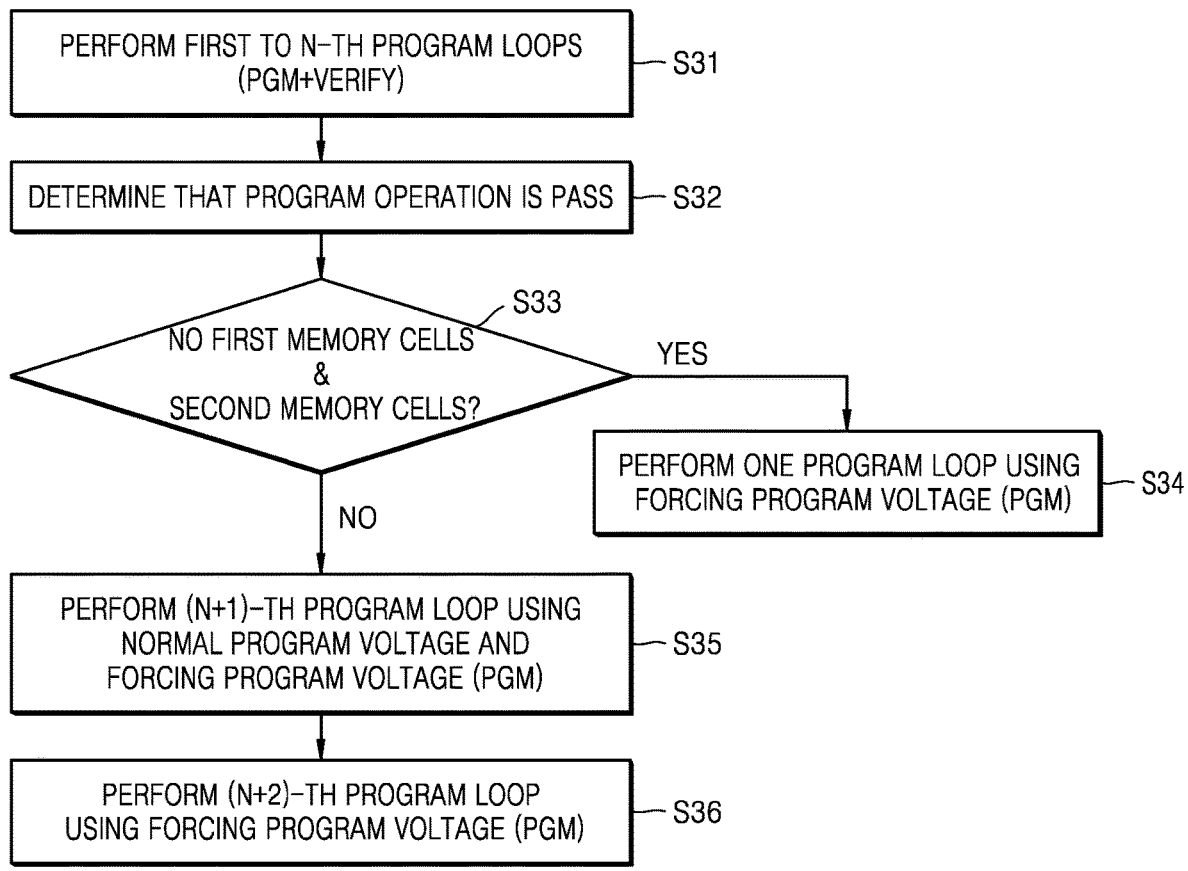
FIGS. 8, 9A, and 9B are flowcharts showing write operations according to example embodiments of the inventive concept.
Figure 9A:
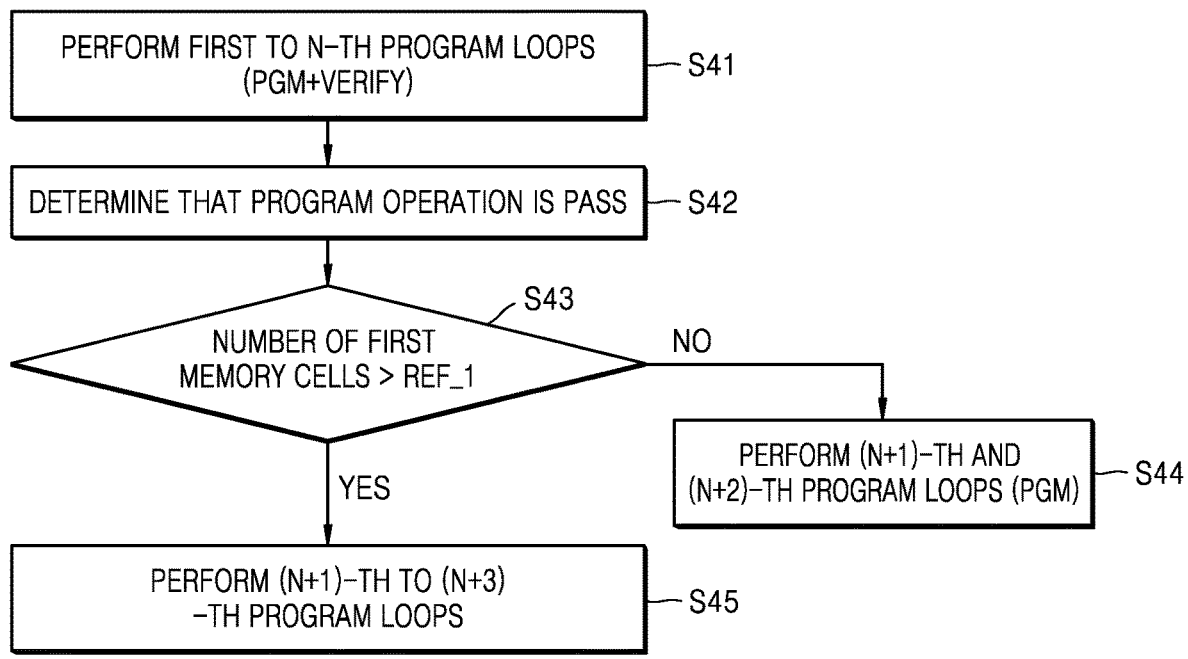
Figure 9B:
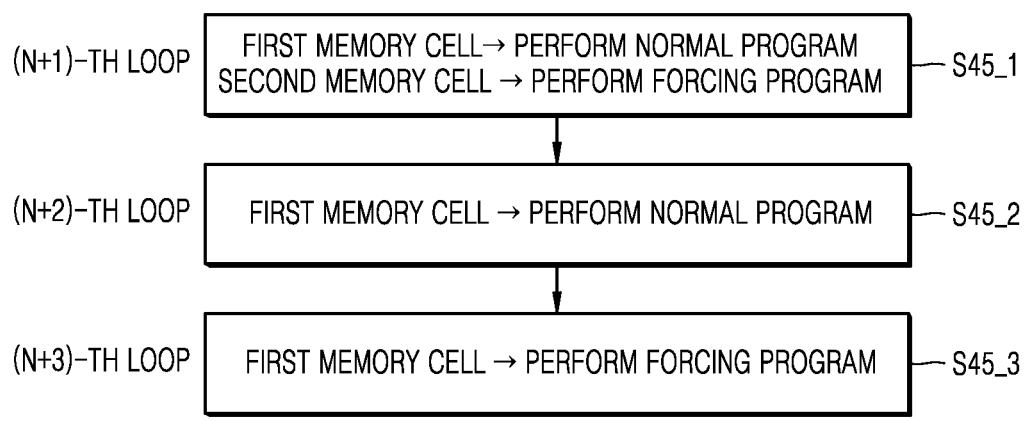

FIGS. 8, 9A, and 9B are flowcharts showing write operations according to example embodiments of the inventive concept.

Referring to FIG. 8, first to N-th program loops are performed (operation S31), and a program operation and a verify operation according to the above-described embodiments may be performed in the first to N-th program loops. Also, it is determined whether a program operation is a pass or a fail at a predetermined timing (or time), and it may be determined that the program operation is a pass (operation S32).

As the N-th program loop is performed, memory cells may have various threshold voltages, and, through a 2-step verify operation, first memory cells corresponding to coarse on cells and second memory cells corresponding to coarse off/fine on cells may be determined. Also, it is determined whether there are no first memory cells and there are only second memory cells (operation S33). When there are no first memory cells and there are only second memory cells, one program loop using a forcing program voltage is performed without an additional verify operation (operation S34). Thus, a write operation is completed after a forcing program operation is performed on the second memory cells.

On the other hand, when there are first memory cells together with second memory cells, at least two more program loops may be performed without performing an additional verify operation. For example, in the (N+1)-th program loop, a normal program operation may be performed on the first memory cells by using a normal program voltage, and a forcing program operation may be performed on the second memory cells by using a forcing program voltage (operation S35). Also, a forcing program operation may be performed on the first memory cells by using a forcing program voltage in the (N+2)-th program loop (operation S36).

According to the above embodiment, the number of additional program loops in which a verify operation is not performed may vary based on a threshold voltage distribution of memory cells in a pass/fail determination operation. Therefore, the threshold voltage distribution of a plurality of memory cells may be effectively adjusted during a write operation.

FIGS. 9A and 9B show cases of performing three or more program loops in which the verify operation is skipped.

Referring to FIG. 9A, first to N-th program loops are performed (operation S41), and a program operation and a verify operation according to the above-described embodiments may be performed in the first to N-th program loops. Also, it is determined whether a program operation is a pass or a fail at a predetermined timing (or time). It may be determined that the program operation is a pass (operation S42).

As the N-th program loop is performed, memory cells may have various threshold voltages, and the number of first memory cells corresponding to coarse on cells is determined (operation S43). For example, the number of first memory cells may be compared with a predetermined reference value Ref_1. When the number of first memory cells is less than the reference value Ref_1, it may indicate that the number of memory cells having threshold voltages less than a first threshold voltage is relatively small, which is the criterion of a coarse on cell. In other words, when the number of coarse on cells is relatively small, a write operation may be completed by performing two additional program loops. For example, by performing the (N+1)-th program loop and the (N+2)-th program loop, the write operation may be completed (operation S44).

On the other hand, when the number of first memory cells is greater than the reference value Ref_1, it may indicate that the number of memory cells having threshold voltages less than the first threshold voltage is relatively large, which is the criterion of a coarse on cell. In other words, when the number of coarse on cells is relatively large, more additional program loops in which a verify operation is skipped may be performed. For example, a write operation may be completed by performing (N+1)-th to (N+3)-th program loops (operation S45).

Meanwhile, in operation S45 for performing the (N+1)-th to (N+3)-th program loops, program operations may be performed in various ways. Referring to FIG. 9B, in the (N+1)-th program loop, a normal program operation using a normal program voltage may be performed on first memory cells, and a forcing program operation using a forcing program voltage may be performed on second memory cells (operation S45_1). Also, in the (N+2)-th program loop, programming the second memory cells may be inhibited, and a normal program operation using a normal program voltage may be selectively performed only on the first memory cells (operation S45_2). Also, in the (N+3)-th program loop, programming the second memory cells may be inhibited, and a forcing program operation using a forcing program voltage may be selectively performed only on the first memory cells (operation S45_3).

The embodiment illustrated in FIG. 9B is a description of one possible operation, and embodiments of the inventive concept are not necessarily limited thereto. For example, more additional program loops in which a verify operation is skipped may be performed, and different types of program operations may be applied to respective program loops. For example, program loops may also be controlled, such that a forcing program operation is performed on the first memory cells in the (N+2)-th program loop and the (N+3)-th program loop. Alternatively, program loops may also be controlled, such that a forcing program operation is performed on the first memory cells in the (N+1)-th to (N+3)-th program loops.

Figure 10:
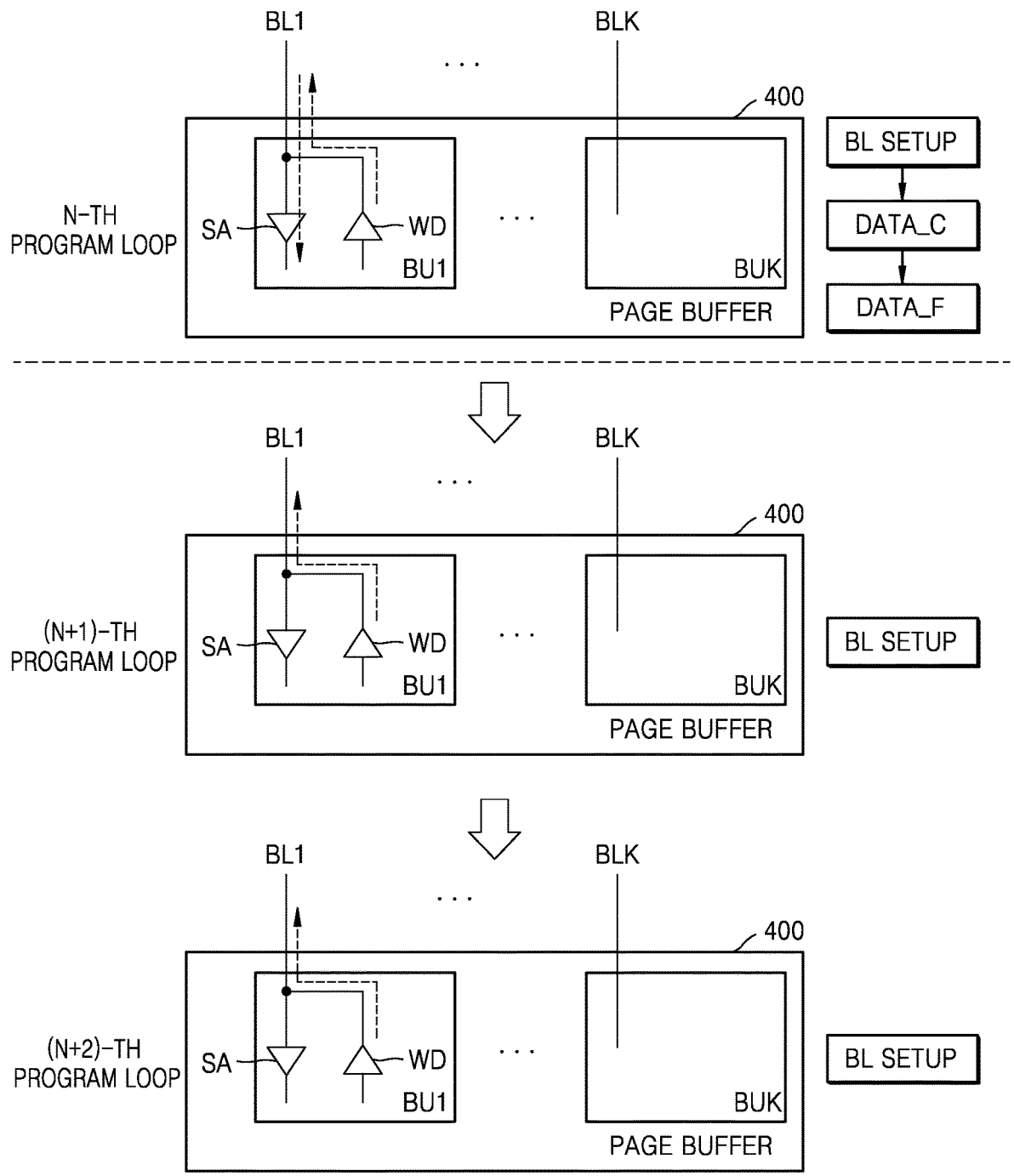
FIG. 10 is a diagram showing an example implementation of a memory device according to an example embodiment of the inventive concept.

FIG. 10 is a diagram showing an example implementation of a memory device according to an example embodiment of the inventive concept. FIG. 10 shows a page buffer 400 provided in a memory device and an operation example of the page buffer 400 in a plurality of program loops.

The page buffer 400 may include a plurality of buffer units (e.g., first to K-th buffer units Bil1 to BUK) respectively corresponding to bit lines BL1 to BLK. Each buffer unit may function as a sense amplifier during a data read operation or a verify operation and may also perform a function of a write driver during a write operation. Also, although not shown in FIG. 10, each buffer unit may include one or more latches (not shown) for storing write data and/or read data.

In the N-th program loop in which a program operation and a verify operation are performed, a setup operation for the bit lines BL1 to BLK may be performed to perform the program operation. Through the setup operation, the bit lines BL1 to BLK may be set up to various voltage levels. For example, in a normal program operation, bit lines respectively corresponding to program-inhibited memory cells may be set to a power voltage, whereas bit lines respectively corresponding to memory cells to be programmed may be set to a ground voltage. Also, in a forcing program operation based on BL forcing, bit lines respectively corresponding to program-inhibited memory cells may be set to the power voltage, whereas bit lines respectively corresponding to memory cells to be programmed may be set to a voltage having a level between the ground voltage and the power voltage.

Meanwhile, in the N-th program loop, as a 2-step verify operation is performed, data may be read based on at least two threshold voltages, and read data may be provided to the page buffer 400 through the bit lines BL1 to BLK. For example, data may be read based on a first threshold voltage and provided to the page buffer 400 through the bit lines BL1 to BLK and, at the same time, data may be read based on a second threshold voltage that is greater than the first threshold voltage and provided to the page buffer 400 through the lines BL1 to BLK. For example, coarse on cells and coarse-off cells may be determined based on data DATA_C read based on the first threshold voltage, and fine on cells and fine off cells may be determined based on data DATA_F read based on the second threshold voltage. Also, the data DATA_C and the data DATA_F may be stored in latches (not shown) in the page buffer 400.

On the other hand, in the (N+1)-th program loop and the (N+2)-th program loop in which a verify operation is skipped, a setup operation for the bit lines BL1 to BLK may be selectively performed without receiving data through the page buffer 400. For example, in each of the (N+1)-th program loop and the (N+2)-th program loop, at least one of a bit line setup operation for performing a normal program operation and a bit line setup operation for performing a forcing program operation may be performed.

Figure 11:
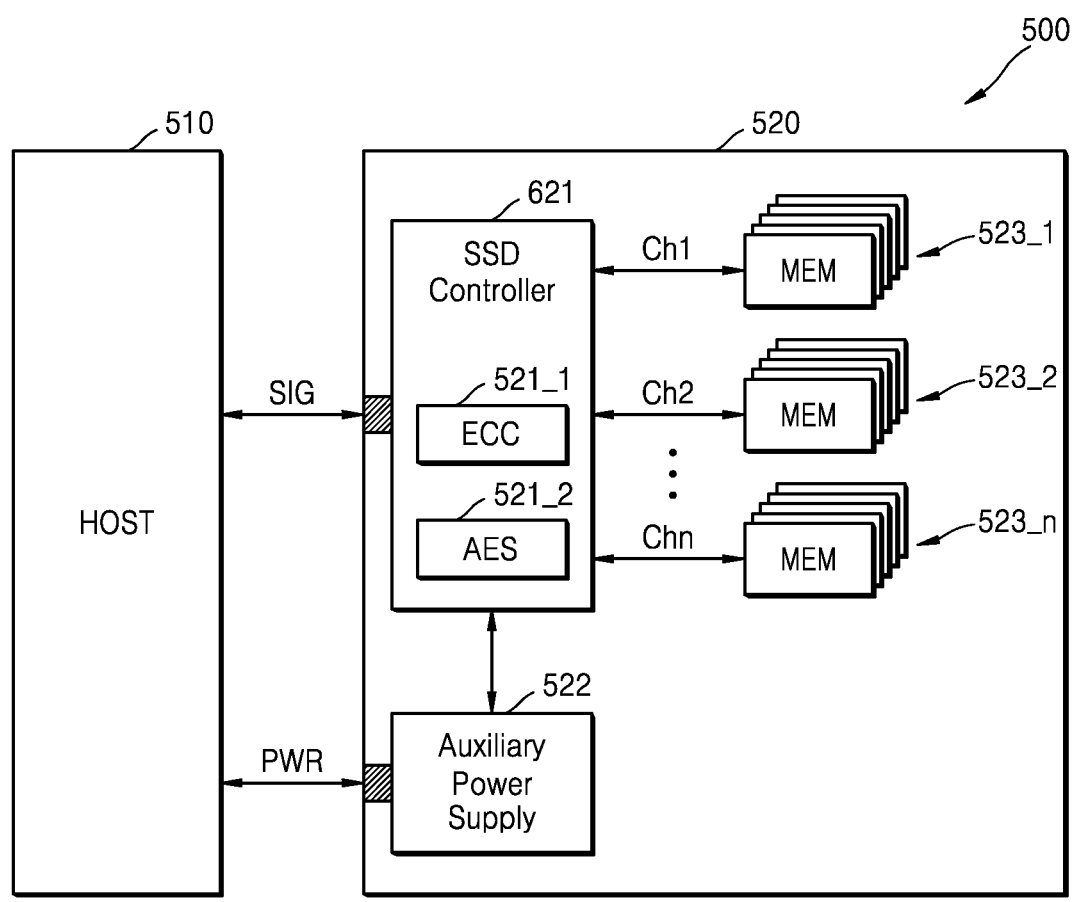
FIG. 11 is a block diagram showing an example in which a memory device according to embodiments of the inventive concept is applied to a solid state drive (SSD) system.

FIG. 11 is a block diagram showing an example in which a memory device according to embodiments of the inventive concept is applied to a solid state drive (SSD) system.

Referring to FIG. 11, an SSD system 500 includes a host 510 and an SSD 520. The SSD 520 exchanges signals SIG with the host 510 through a signal connector and receives power PWR through a power connector. The SSD 520 includes an SSD controller 521, an auxiliary power supply 522, and memory devices 523_1 to 523_n. The memory devices 523_1 to 523_n may be vertically stacked NAND flash memory devices. The SSD controller 521 may be connected to the memory devices 523_1 to 523_n through a plurality of channels Ch1 to Chn. In this case, the memory devices 523_1 to 523_n may each be implemented according to the embodiments described above with reference to FIGS. 1 to 10. In other words, the memory devices 523_1 to 523_n may each perform a plurality of program loops during a write operation, and, in at least two program loops from among the program loops, only a program operation may be performed without performing a 2-step verify operation.

The SSD controller 521 may include an error correction code (ECC) circuit 521_1 and an advanced encryption standard (AES) circuit 521_2. Also, although not shown in FIG. 11, the SSD controller 521 may further include components like a processor for controlling the overall operation of the SSD 520, a buffer, random access memory (RAM), a host interface, and a memory interface.

The ECC circuit 521_1 may perform an ECC encoding and an ECC decoding on data stored in the memory devices 523_1 to 523_n or read from the memory devices 523_1 to 523_n. For example, the ECC circuit 521_1 may generate a parity used for detecting and correcting errors through an ECC encoding processing for data to be written and may perform an error detection operation and an error correction operation based on data read from the memory devices 523_1 to 523_n and the parity. Also, the AES circuit 521_2 may perform at least one of an encryption operation and a decryption operation for data input/output to/from the SSD controller 521 using various types of encryption/decryption algorithms (e.g., a symmetric-key algorithm).

Figure 12:
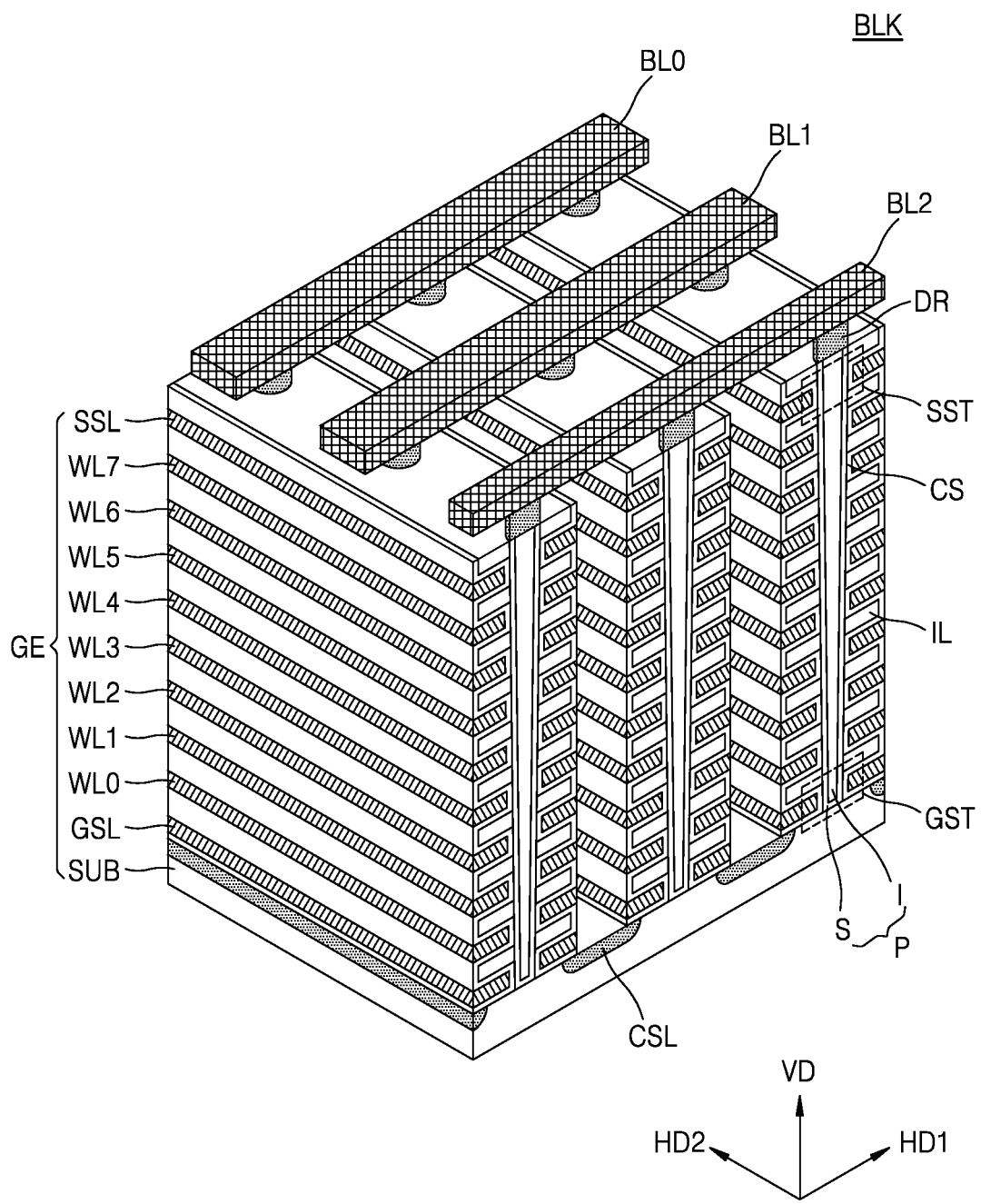
FIG. 12 is a perspective view of an example implementation of the memory block of FIG. 2 according to an embodiment of the inventive concept.

FIG. 12 is a perspective view of an example implementation of a memory block of FIG. 2 according to an embodiment of the inventive concept.

Referring to FIG. 12, a memory block BLK is formed in a vertical direction with respect to a substrate SUB. The substrate SUB has a first conductivity type (e.g., p type), and common source lines CSL that extend in a second horizontal direction HD2 and are doped with impurities of a second conductivity type (e.g., n type) are provided in the substrate SUB. A plurality of insulation films IL extending in the second horizontal direction HD2 are sequentially provided in a vertical direction VD on a region of the substrate SUB between two adjacent common source lines CSL, and the insulation films IL are a certain distance apart from each other in the vertical direction VD. For example, the insulation films IL may include an insulating material like silicon oxide.

A plurality of pillars P, which are sequentially arranged in the second horizontal direction HD2 and penetrate through the insulation films IL in the vertical direction VD, are provided on the region of the substrate SUB between two adjacent common source lines CSL. For example, the pillars P may contact the substrate SUB by penetrating through the insulation films IL. In detail, a surface layer S of each pillar P may include a silicon-based material doped with impurities of the first conductivity type and function as a channel region. On the other hand, an internal layer I of each pillar P may include an insulating material like silicon oxide or an air gap.

A charge storage layer CS is provided along exposed surfaces of the insulation films IL, the pillars P, and the substrate SUB in the region between the two adjacent common source lines CSL. The charge storage layer CS may include a gate insulation layer (also referred to as a 'tunneling insulation layer'), a charge trapping layer, and a blocking insulation layer. For example, the charge storage layer CS may have an oxide-nitride-oxide (ONO) structure. Also, gate electrodes GE like selected gate lines GSL and SSL and the word lines WL0 through WL7 is provided on an exposed surface of the charge storage layer CS in the region between the two adjacent common source lines CSL.

Drains or drain contacts DR are provided on the pillars P, respectively. For example, the drains or the drain contacts DR may include a silicon-based material doped with impurities of the second conductivity type. Bit lines BL1 to BL3 extending in a first horizontal direction HD1 and being a certain distance apart from one another in the second horizontal direction HD2 may be provided on the drain contacts DR.

Figure 13:
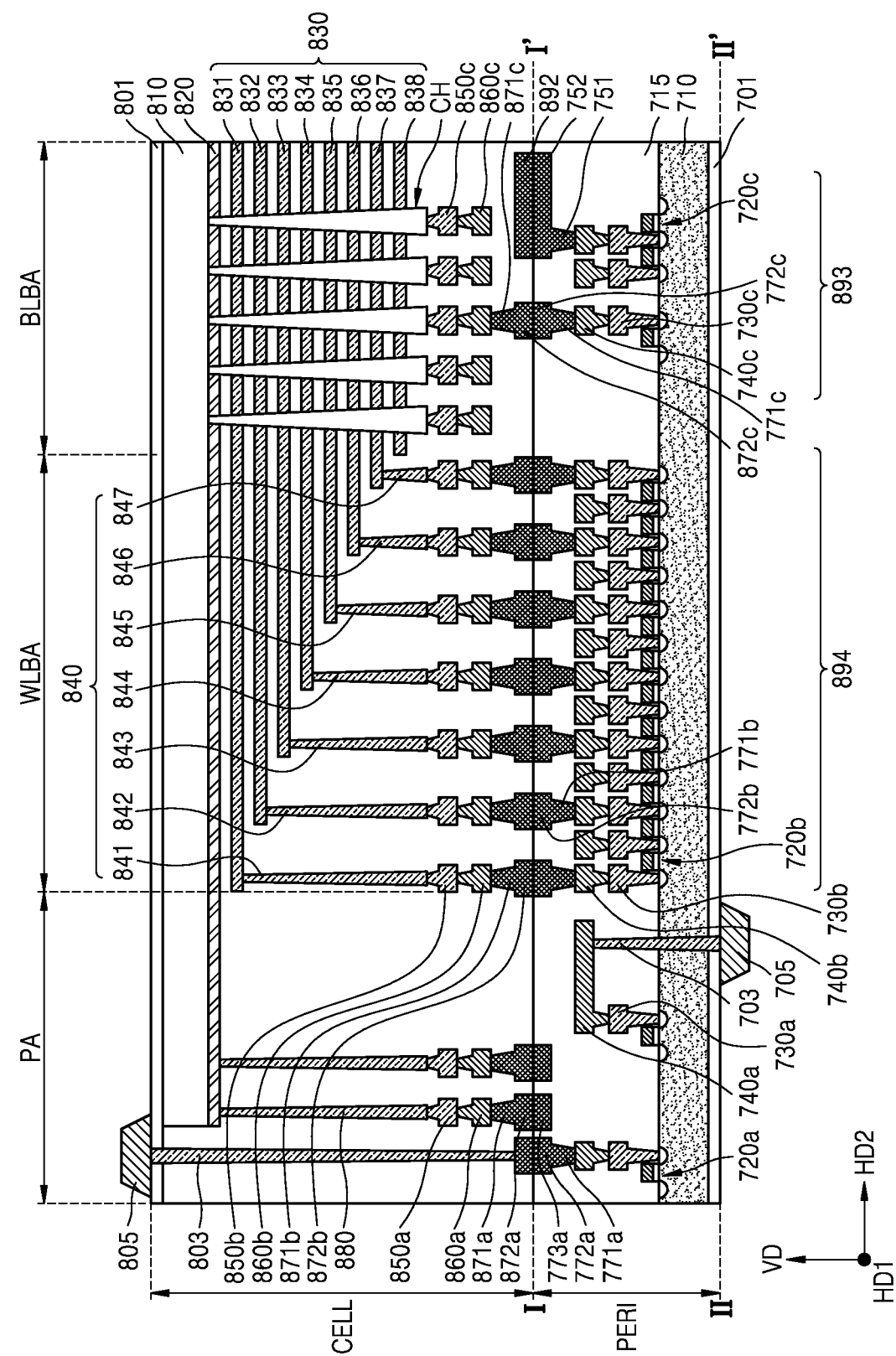
FIG. 13 is a cross-sectional view of a memory device according to an embodiment of the inventive concept.

FIG. 13 is a diagram illustrating a memory device 600 according to another example embodiment.

Referring to FIG. 13, a memory device 600 may have a chip-to-chip (C2C) structure. The C2C structure may refer to a structure formed by manufacturing an upper chip including a cell region CELL on a first wafer, manufacturing a lower chip including a peripheral circuit region PERI on a second wafer, separate from the first wafer, and then bonding the upper chip and the lower chip to each other. Here, the bonding process may include a method of electrically connecting a bonding metal formed on an uppermost metal layer of the upper chip and a bonding metal formed on an uppermost metal layer of the lower chip. For example, when the bonding metals may include copper (Cu) using a Cu-to-Cu bonding. The example embodiment, however, is not limited thereto. For example, the bonding metals may also be formed of aluminum (Al) or tungsten (W). For example, the page buffer described above with reference to FIGS. 1 to 12 may be disposed in the peripheral circuit region PERI.

Each of the peripheral circuit region PERI and the cell region CELL of the memory device 600 may include an external pad bonding area PA, a word line bonding area WLBA, and a bit line bonding area BLBA.

The peripheral circuit region PERI may include a first substrate 710, an interlayer insulating layer 715, a plurality of circuit elements 720a, 720b, and 720c formed on the first substrate 710, first metal layers 730a, 730b, and 730c respectively connected to the plurality of circuit elements 720a, 720b, and 720c, and second metal layers 740a, 740b, and 740c formed on the first metal layers 730a, 730b, and 730c. In an example embodiment, the first metal layers 730a, 730b, and 730c may be formed of tungsten having relatively high electrical resistivity, and the second metal layers 740a, 740b, and 740c may be formed of copper having relatively low electrical resistivity.

In an example embodiment illustrate in FIG. 13, although only the first metal layers 730a, 730b, and 730c and the second metal layers 740a, 740b, and 740c are shown and described, the example embodiment is not limited thereto, and one or more additional metal layers may be further formed on the second metal layers 740a, 740b, and 740c. At least a portion of the one or more additional metal layers formed on the second metal layers 740a, 740b, and 740c may be formed of aluminum or the like having a lower electrical resistivity than those of copper forming the second metal layers 740a, 740b, and 740c.

The interlayer insulating layer 715 may be disposed on the first substrate 710 and cover the plurality of circuit elements 720a, 720b, and 720c, the first metal layers 730a, 730b, and 730c, and the second metal layers 740a, 740b, and 740c. The interlayer insulating layer 715 may include an insulating material such as silicon oxide, silicon nitride, or the like.

Lower bonding metals 771b and 772b may be formed on the second metal layer 740b in the word line bonding area WLBA. In the word line bonding area WLBA, the lower bonding metals 771b and 772b in the peripheral circuit region PERI may be electrically bonded to upper bonding metals 871b and 872b of the cell region CELL. The lower bonding metals 771b and 772b and the upper bonding metals 871b and 872b may be formed of aluminum, copper, tungsten, or the like. Further, the upper bonding metals 871b and 872b in the cell region CELL may be referred as first metal pads and the lower bonding metals 771b and 772b in the peripheral circuit region PERI may be referred as second metal pads.

The cell region CELL may include at least one memory block. The cell region CELL may include a second substrate 810 and a common source line 820. On the second substrate 810, a plurality of word lines 831 to 838 (i.e., 830) may be stacked in a direction (a Z-axis direction), perpendicular to an upper surface of the second substrate 810. At least one string select line and at least one ground select line may be arranged on and below the plurality of word lines 830, respectively, and the plurality of word lines 830 may be disposed between the at least one string select line and the at least one ground select line.

In the bit line bonding area BLBA, a channel structure CH may extend in a direction (a Z-axis direction), perpendicular to the upper surface of the second substrate 810, and pass through the plurality of word lines 830, the at least one string select line, and the at least one ground select line. The channel structure CH may include a data storage layer, a channel layer, a buried insulating layer, and the like, and the channel layer may be electrically connected to a first metal layer 850c and a second metal layer 860c. For example, the first metal layer 850c may be a bit line contact, and the second metal layer 860c may be a bit line. In an example embodiment, the bit line 860c may extend in a first direction (a Y-axis direction), parallel to the upper surface of the second substrate 810.

In an example embodiment illustrated in FIG. 13, an area in which the channel structure CH, the bit line 860c, and the like are disposed may be defined as the bit line bonding area BLBA. In the bit line bonding area BLBA, the bit line 860c may be electrically connected to the circuit elements 720c providing a page buffer 893 in the peripheral circuit region PERI. The bit line 860c may be connected to upper bonding metals 871c and 872c in the cell region CELL, and the upper bonding metals 871c and 872c may be connected to lower bonding metals 771c and 772c connected to the circuit elements 720c of the page buffer 893. In an exemplary embodiment of the present disclosure, the bit line may be connected to the page buffer 893, and various set-up operations for the bit line may be performed to perform a normal program and a forcing program. Further, according to the embodiments of the present disclosure, in order to perform a 2-step verification operation, data read based on a first threshold voltage and data read based on a second threshold voltage may be provided to the page buffer 893 through a bit line. That is, in a program loop in which the verification operation is skipped, data read based on the first and second threshold voltages is not provided to the page buffer 893.

In the word line bonding area WLBA, the plurality of word lines 830 may extend in a second direction (an X-axis direction), parallel to the upper surface of the second substrate 810 and perpendicular to the first direction, and may be connected to a plurality of cell contact plugs 841 to 847 (i.e., 840). The plurality of word lines 830 and the plurality of cell contact plugs 840 may be connected to each other in pads provided by at least a portion of the plurality of word lines 830 extending in different lengths in the second direction. A first metal layer 850b and a second metal layer 860b may be connected to an upper portion of the plurality of cell contact plugs 840 connected to the plurality of word lines 830, sequentially. The plurality of cell contact plugs 840 may be connected to the peripheral circuit region PERI by the upper bonding metals 871b and 872b of the cell region CELL and the lower bonding metals 771b and 772b of the peripheral circuit region PERI in the word line bonding area WLBA.

The plurality of cell contact plugs 840 may be electrically connected to the circuit elements 720b forming a row decoder 894 in the peripheral circuit region PERI. In an example embodiment, operating voltages of the circuit elements 720b of the row decoder 894 may be different than operating voltages of the circuit elements 720c forming the page buffer 893. For example, operating voltages of the circuit elements 720c forming the page buffer 893 may be greater than operating voltages of the circuit elements 720b forming the row decoder 894.

A common source line contact plug 880 may be disposed in the external pad bonding area PA. The common source line contact plug 880 may be formed of a conductive material such as a metal, a metal compound, polysilicon, or the like, and may be electrically connected to the common source line 820. A first metal layer 850a and a second metal layer 860a may be stacked on an upper portion of the common source line contact plug 880, sequentially. For example, an area in which the common source line contact plug 880, the first metal layer 850a, and the second metal layer 860a are disposed may be defined as the external pad bonding area PA.

Input-output pads 705 and 805 may be disposed in the external pad bonding area PA. Referring to FIG. 13, a lower insulating film 701 covering a lower surface of the first substrate 710 may be formed below the first substrate 710, and a first input-output pad 705 may be formed on the lower insulating film 701. The first input-output pad 705 may be connected to at least one of the plurality of circuit elements 720a, 720b, and 720c disposed in the peripheral circuit region PERI through a first input-output contact plug 703, and may be separated from the first substrate 710 by the lower insulating film 701. In addition, a side insulating film may be disposed between the first input-output contact plug 703 and the first substrate 710 to electrically separate the first input-output contact plug 703 and the first substrate 710.

Referring to FIG. 13, an upper insulating film 801 covering the upper surface of the second substrate 810 may be formed on the second substrate 810, and a second input-output pad 805 may be disposed on the upper insulating layer 801. The second input-output pad 805 may be connected to at least one of the plurality of circuit elements 720a, 720b, and 720c disposed in the peripheral circuit region PERI through a second input-output contact plug 803. In the example embodiment, the second input-output pad 805 is electrically connected to a circuit element 720a.

According to embodiments, the second substrate 810 and the common source line 820 are not disposed in an area in which the second input-output contact plug 803 is disposed. Also, the second input-output pad 805 do not overlap the word lines 830 in the third direction (the Z-axis direction). Referring to FIG. 13, the second input-output contact plug 303 may be separated from the second substrate 810 in a direction, parallel to the upper surface of the second substrate 810, and may pass through the interlayer insulating layer 815 of the cell region CELL to be connected to the second input-output pad 805.

According to embodiments, the first input-output pad 705 and the second input-output pad 805 may be selectively formed. For example, the memory device 600 may include only the first input-output pad 705 disposed on the first substrate 710 or the second input-output pad 805 disposed on the second substrate 810. Alternatively, the memory device 600 may include both the first input-output pad 705 and the second input-output pad 805.

A metal pattern provided on an uppermost metal layer may be provided as a dummy pattern or the uppermost metal layer may be absent, in each of the external pad bonding area PA and the bit line bonding area BLBA, respectively included in the cell region CELL and the peripheral circuit region PERI.

In the external pad bonding area PA, the memory device 600 may include a lower metal pattern 773a, corresponding to an upper metal pattern 872a formed in an uppermost metal layer of the cell region CELL, and having the same cross-sectional shape as the upper metal pattern 872a of the cell region CELL so as to be connected to each other, in an uppermost metal layer of the peripheral circuit region PERI. In the peripheral circuit region PERI, the lower metal pattern 773a formed in the uppermost metal layer of the peripheral circuit region PERI are not connected to a contact. Similarly, in the external pad bonding area PA, an upper metal pattern 872a, corresponding to the lower metal pattern 773a formed in an uppermost metal layer of the peripheral circuit region PERI, and having the same shape as a lower metal pattern 773a of the peripheral circuit region PERI, may be formed in an uppermost metal layer of the cell region CELL.

The lower bonding metals 771b and 772b may be formed on the second metal layer 740b in the word line bonding area WLBA. In the word line bonding area WLBA, the lower bonding metals 771b and 772b of the peripheral circuit region PERI may be electrically connected to the upper bonding metals 871b and 872b of the cell region CELL by a Cu-to-Cu bonding.

Further, in the bit line bonding area BLBA, an upper metal pattern 892, corresponding to a lower metal pattern 752 formed in the uppermost metal layer of the peripheral circuit region PERI, and having the same cross-sectional shape as the lower metal pattern 752 of the peripheral circuit region PERI, may be formed in an uppermost metal layer of the cell region CELL. A contact is not formed on the upper metal pattern 892 formed in the uppermost metal layer of the cell region CELL.

In an example embodiment, corresponding to a metal pattern formed in an uppermost metal layer in one of the cell region CELL and the peripheral circuit region PERI, a reinforcement metal pattern having the same cross-sectional shape as the metal pattern may be formed in an uppermost metal layer in the other one of the cell region CELL and the peripheral circuit region PERI. In an embodiment, a contact is not formed on the reinforcement metal pattern.

While the inventive concept has been particularly shown and described with reference to embodiments thereof, it will be understood that various changes in form and details may be made therein without departing from the spirit and scope of the disclosure.

What is claimed is:

1. A memory device comprising:
   a memory cell array comprising a plurality of memory cells;
   a voltage generator configured to generate voltages used for a program operation and a verify operation for the memory cells; and
   a control logic configured to perform a plurality of program loops while writing data to the memory cell array, such that first to N-th program loops comprising a program operation and a verify operation are performed and at least two program loops are performed in which the verify operation is skipped when a pass/fail determination of the program operation of the N-th program loop indicates a pass,
   wherein N is an integer equal to or greater than 1,
   wherein the at least two program loops comprises an (N+1)-th program loop comprising a normal program operation on first memory cells among the memory cells using a normal program voltage, and a forcing program operation on second memory cells among the memory cells using a forcing program voltage different from the program voltage.

2. The memory device of claim 1, wherein the at least two program loops comprise:
an (N+2)-th program loop comprising a forcing program operation on the first memory cells using the forcing program voltage.

3. The memory device of claim 2, wherein the control logic is configured to control the voltage generator to generate voltages used for the program operation and the verify operation in the first to N-th program loops, and
control the voltage generator to selectively generate voltages used in the program operation in the at least two program loops.

4. The memory device of claim 2, wherein the verify operation comprises an operation for determining coarse on cells and coarse off cells based on a first threshold voltage and an operation for determining fine on cells and fine off cells based on a second threshold voltage, and
the second threshold voltage is greater than the first threshold voltage.

5. The memory device of claim 4, wherein the memory cells having threshold voltage levels lower than the first threshold voltage correspond to the first memory cells, and the memory cells having threshold voltage levels greater than the first threshold voltage and less than the second threshold voltage correspond to the second memory cells.

6. The memory device of claim 4, wherein the pass/fail determination is performed by counting a number of the memory cells having threshold voltage levels lower than the first threshold voltage or the number of the memory cells having threshold voltage levels lower than the second threshold voltage.

7. The memory device of claim 1, further comprising a page buffer connected to the memory cell array through a plurality of bit lines,
wherein the page buffer receives data read from the memory cell array through the bit lines in relation to the verify operation in the first to N-th program loops, and,
in the at least two program loops, an operation for providing data to the page buffer through the bit lines is skipped.

8. A method of operating a memory device, the method comprising:
performing an N-th program loop comprising a program operation and a verify operation, wherein N is an integer equal to or greater than 1;
determining whether the program operation is pass or fail by counting a number of memory cells of the memory device having threshold voltage levels lower than a predetermined threshold voltage;
when it is determined that the program operation is pass, performing a (N+1)-th program loop comprising a normal program operation using a normal program voltage for first memory cells among the memory cells, and a forcing program operation using a forcing program voltage for second memory cells among the memory cells; and
performing an (N+2)-th program loop comprising a forcing program operation using the forcing program voltage for the first memory cells,
wherein a verify operation is skipped in each of the (N+1)-th program loop and the (N+2)-th program loop.

9. The method of claim 8, wherein the verify operation performed in the N-th program loop comprises an operation for determining coarse on cells and coarse off cells based on a first threshold voltage and an operation for determining fine on cells and fine off cells based on a second threshold voltage, and
the second threshold voltage is greater than the first threshold voltage.

10. The method of claim 9, wherein the memory cells having threshold voltage levels lower than the first threshold voltage correspond to the first memory cells, and the memory cells having threshold voltage levels greater than the first threshold voltage and less than the second threshold voltage correspond to the second memory cells.

11. The method of claim 9, wherein the determination of whether the program operation is a pass or fail is performed by counting the number of the memory cells having threshold voltage levels lower than the first threshold voltage or the number of the memory cells having threshold voltage levels lower than the second threshold voltage.

12. The method of claim 8, further comprising, in an operation for determining whether the program operation is a pass or fail, when it is determined that the program operation is fail,
performing at least one more program loop comprising a program operation and a verify operation before performing the (N+1)-th program loop.

13. The method of claim 8, wherein each of the memory cells is connected to a word line and a bit line, and
a voltage level difference between the word line and the bit line of a memory cell on which the normal program operation is performed is greater than a voltage level difference between the word line and the bit line of a memory cell on which the forcing program operation is performed.

14. The method of claim 13, wherein, in the forcing program operation, a voltage of the same level as a voltage applied to the word line during the normal program operation is provided to the word line, and a voltage of a level greater than the voltage set to the bit line during the normal program operation is provided to the bit line.

15. The method of claim 8, wherein an operation for determining whether the program operation is a pass or fail is performed in parallel with the normal program operation or the forcing program operation in the (N+1)-th program loop.

16. The method of claim 8, wherein the memory device comprises a page buffer, as the verify operation is performed in the N-th program loop, data read from the memory cells is provided to the page buffer, and,
as the verify operation is skipped in each of the (N+1)-th program loop and the (N+2)-th program loop, data is not provided to the page buffer.

17. A method of operating a memory device, the method comprising:
performing first to N-th program loops each comprising a program operation and a verify operation for memory cells of the memory device, wherein N is an integer equal to or greater than 2;
determining whether the program operation is a pass or a fail based on a programming result in the N-th program loop; and,
when it is determined that the program operation is a pass, performing (N+1)-th to (N+A)-th program loops that do not comprise a verify operation for the memory cells, where A is an integer equal to or greater than 2,
wherein, in each of the (N+1)-th to (N+A)-th program loops, at least one of a normal program operation using a normal program voltage and a forcing program operation using a forcing program voltage is performed, wherein the (N+1)-th to (N+A)-th program loops comprises a program loop for performing the normal program operation on first memory cells among the memory cells using a normal program voltage, and the forcing program operation on second memory cells among the memory cells using a forcing program voltage different from the program voltage.

18. The method of claim 17, wherein the memory cells correspond to multilevel cells, each of the program loops comprises a program operation for programming to a plurality of threshold voltage states, and, in each of the (N+1)-th to (N+A)-th program loops, a verify operation related to at least one of the threshold voltage states is skipped.

19. The method of claim 17, wherein, by the verify operation in the N-th program loop, first memory cells having threshold voltage levels lower than a first threshold voltage and second memory cells having threshold voltage levels greater than the first threshold voltage and less than a second threshold voltage are determined.

20. The method of claim 19, wherein the (N+1)-th to (N+A)-th program loops comprise:

a program loop for performing the forcing program operation on the first memory cells.

* * * * *